United States Patent [19]
Iwamoto et al.

[11] Patent Number: 5,940,328
[45] Date of Patent: Aug. 17, 1999

[54] SYNCHRONOUS SEMICONDUCTOR DEVICE WITH MEMORY CHIPS IN A MODULE FOR CONTROLLING OUTPUT OF STROBE SIGNAL FOR TRIGGER IN READING DATA

[75] Inventors: Hisashi Iwamoto; Wataru Sakamoto, both of Tokyo, Japan

[73] Assignee: Mitsubishi Denki Kabushiki Kaisha, Tokyo, Japan

[21] Appl. No.: 08/917,211

[22] Filed: Aug. 25, 1997

[30] Foreign Application Priority Data

Feb. 25, 1997 [JP] Japan ................................. 9-040945

[51] Int. Cl.[6] .................................................. G11C 16/04
[52] U.S. Cl. ............................... 365/189.01; 365/189.04; 365/195; 365/191
[58] Field of Search .................................. 365/52, 233.5, 365/230.03, 233, 189.01, 195, 194, 189.04, 191

[56] References Cited

U.S. PATENT DOCUMENTS 5,513,135  4/1996  Dell et al. .................................. 365/52
5,696,732 12/1997  Zagar et al. ............................. 365/233.5

Primary Examiner—David Nelms
Assistant Examiner—Thong Le
Attorney, Agent, or Firm—Oblon, Spivak, McClelland, Maier & Neustadt, P.C.

[57] ABSTRACT

One strobe signal (QS) is outputted from a group of two adjacent memory chips (MC(i−1), MCi) in each module. In each group, the second memory chip (MCi) receives a data mask signal (DQM(i−1)) inputted to the adjacent first memory chip (MC(i−1)) as a data mask control signal (DQMCi), and stops outputting the strobe signal (QS) when both the data mask signal (DQMi) for the second memory chip (MCi) and the data mask control signal (DQMCi) are activated. Each memory chip (MCi) receives the data mask signal (DQMi) and stops outputting data. In a synchronous DRAM using a strobe signal as a trigger, this configuration allows reduction in the number of strobe signals.

13 Claims, 24 Drawing Sheets

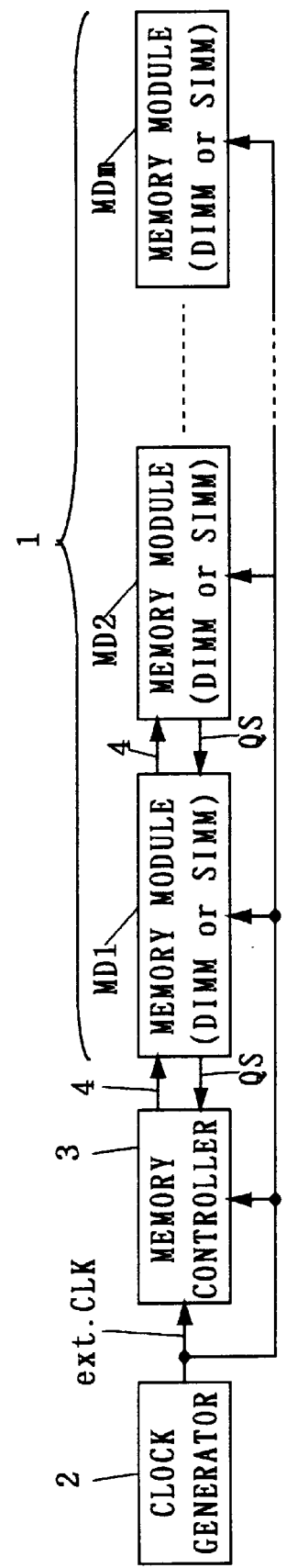

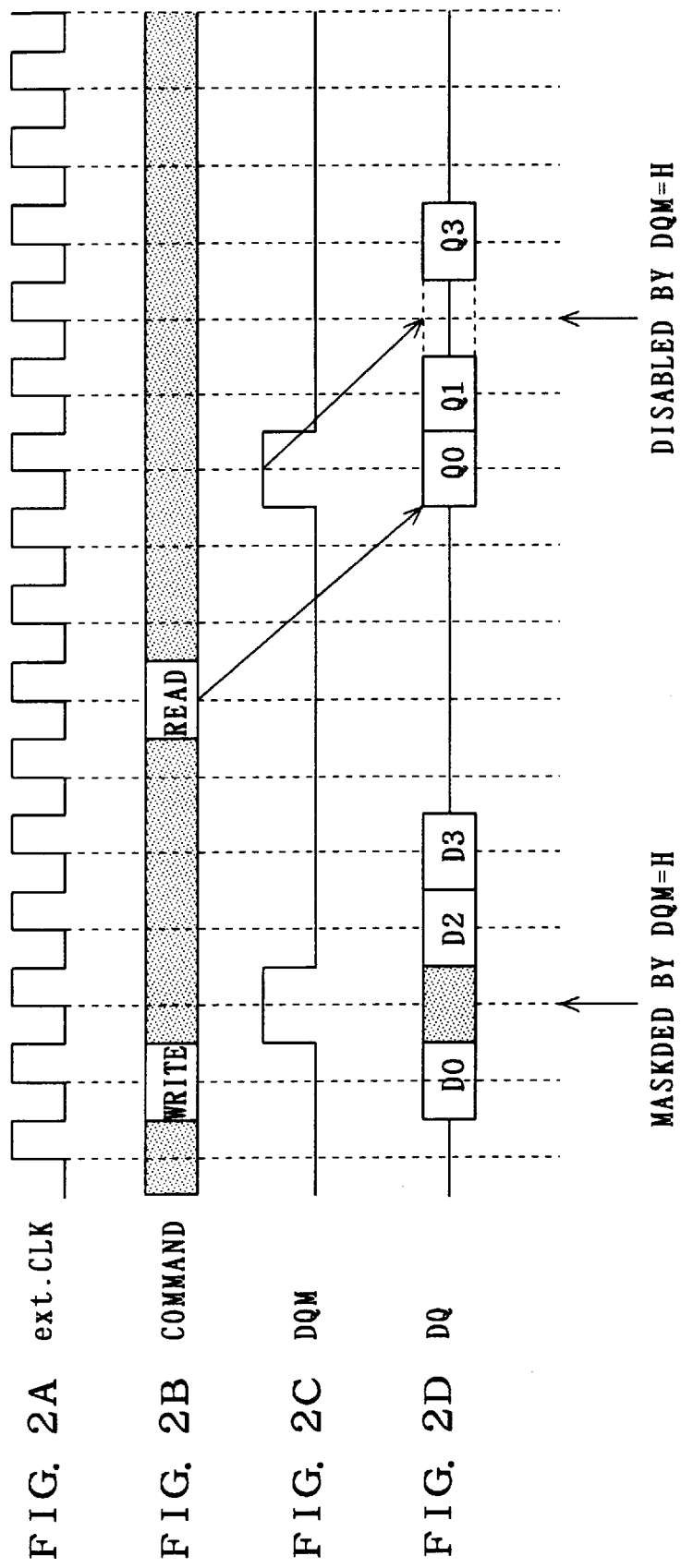

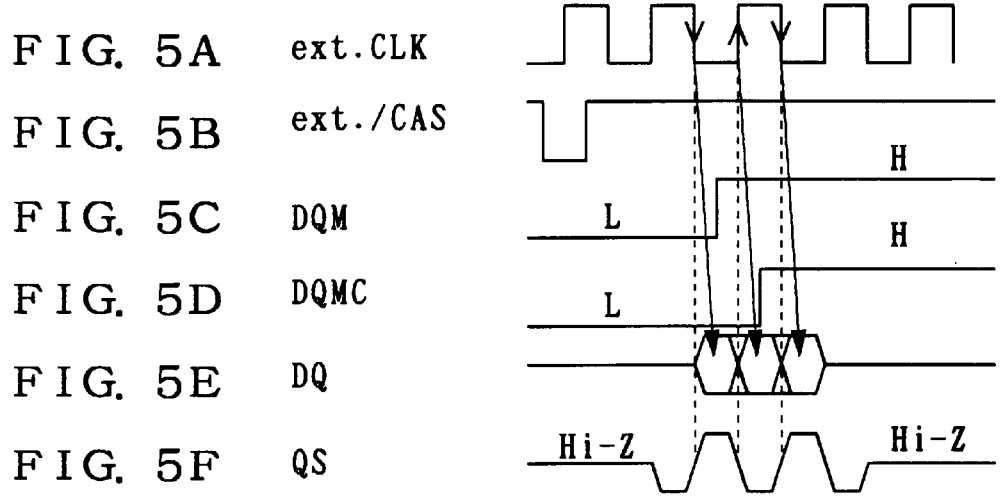
FIG. 5A ext.CLK
FIG. 5B ext./CAS
FIG. 5C DQM
FIG. 5D DQMC
FIG. 5E DQ
FIG. 5F QS
FIG. 6
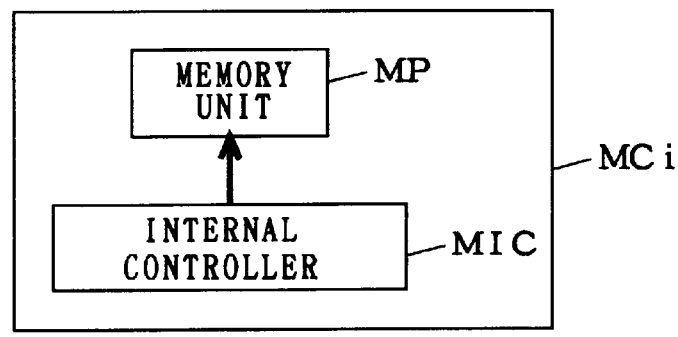
FIG. 7
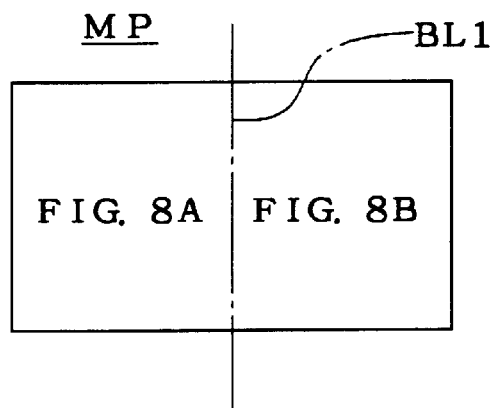

FIG. 10A ext.CLK
FIG. 10B CLK
FIG. 10C CLKx2
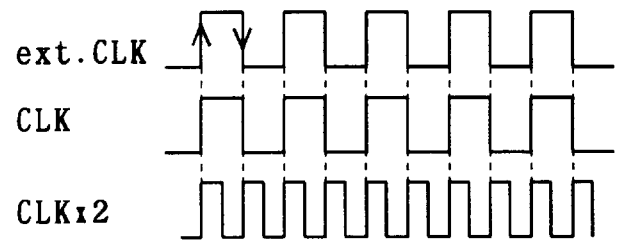
FIG. 11
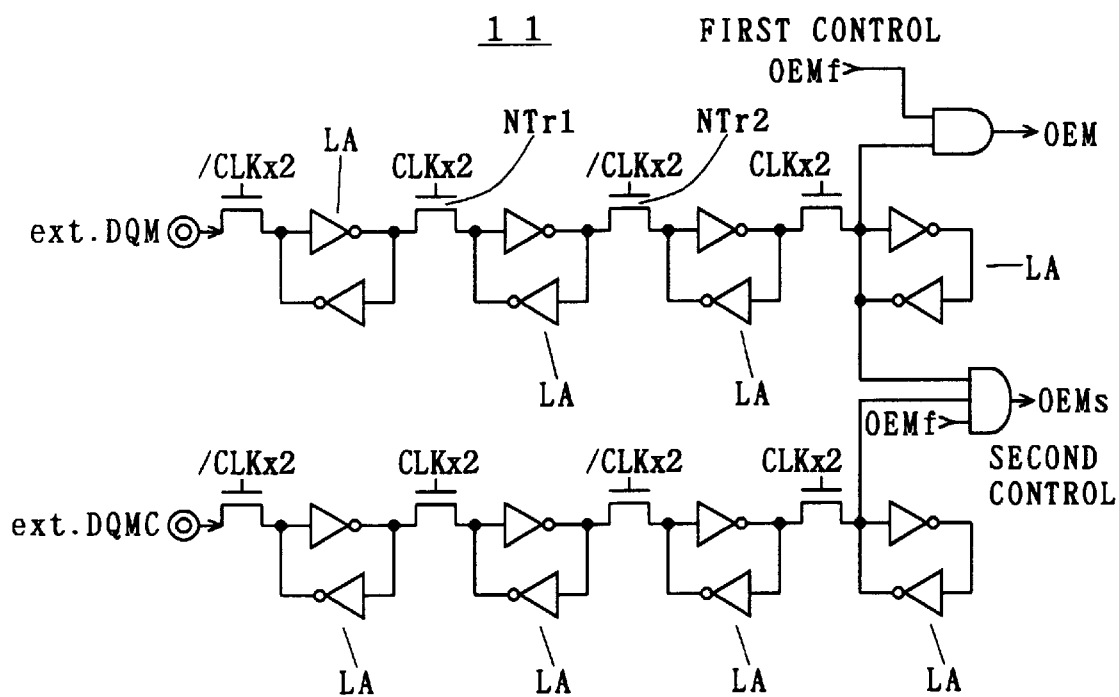

FIG. 12A ext.CLK
FIG. 12B ext.COM.
FIG. 12C CLKx2
FIG. 12D OEMf
FIG. 12E DQi
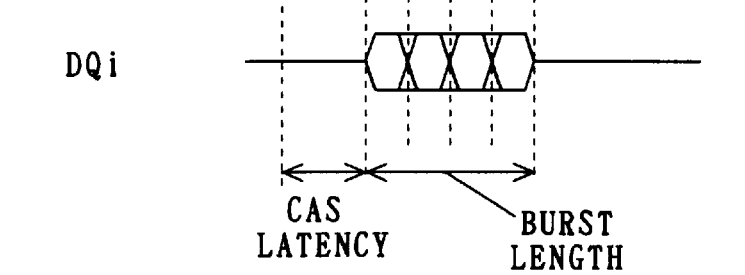
FIG. 13
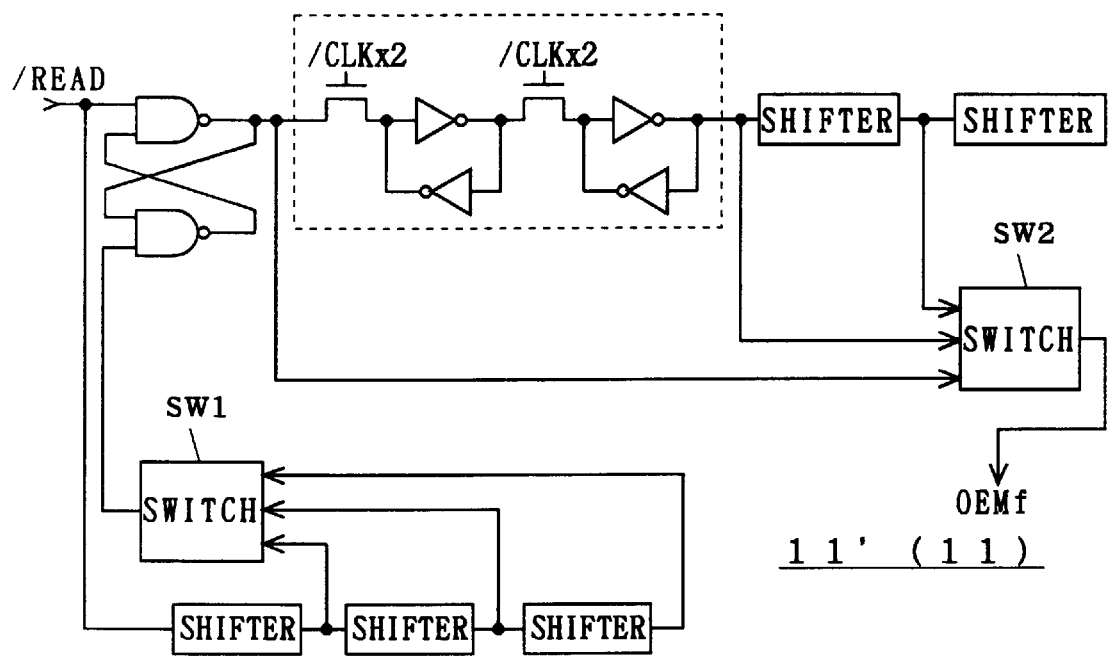

FIG. 16A ext.CLK
FIG. 16B ext./CAS
FIG. 16C DQM
FIG. 16D DQMC
FIG. 16E DQ
FIG. 16F QS
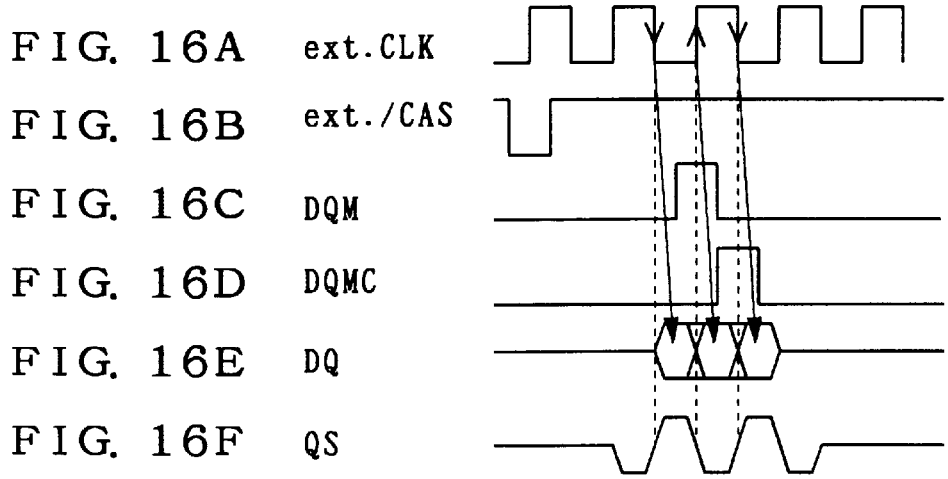
FIG. 17
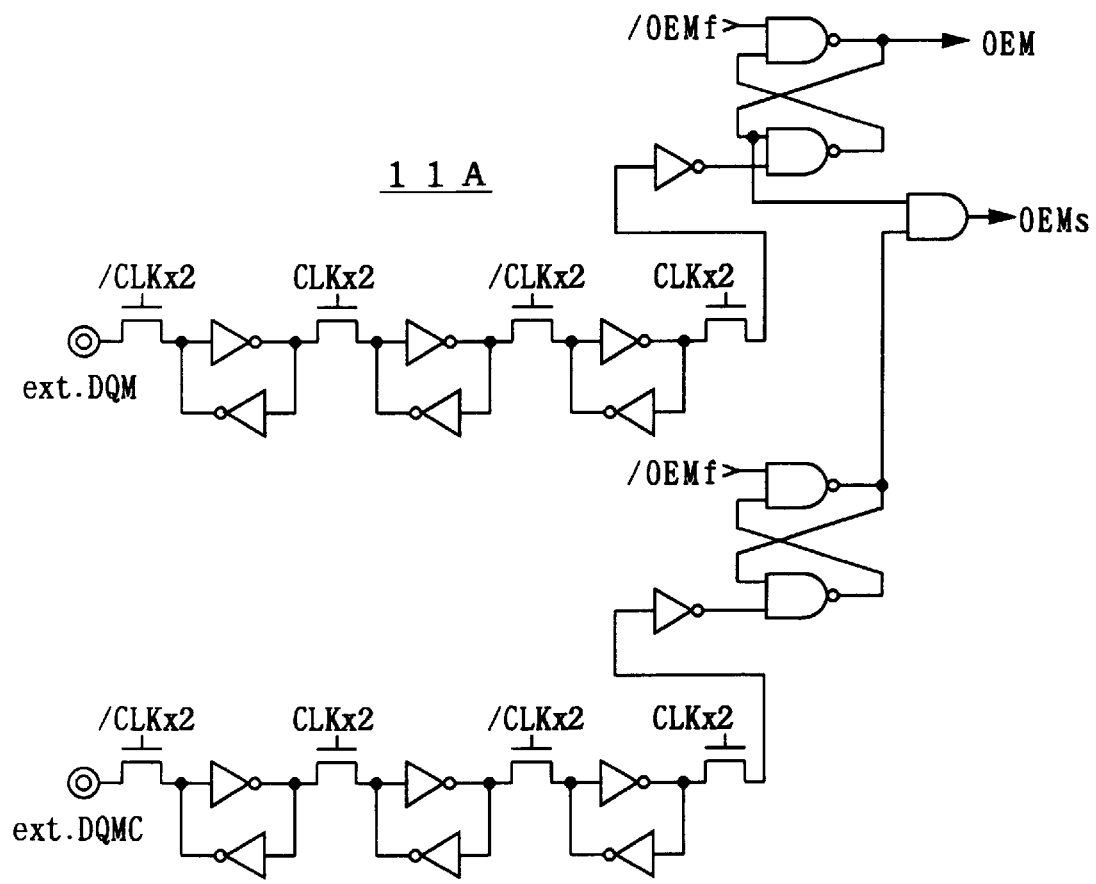

F I G. 1 8
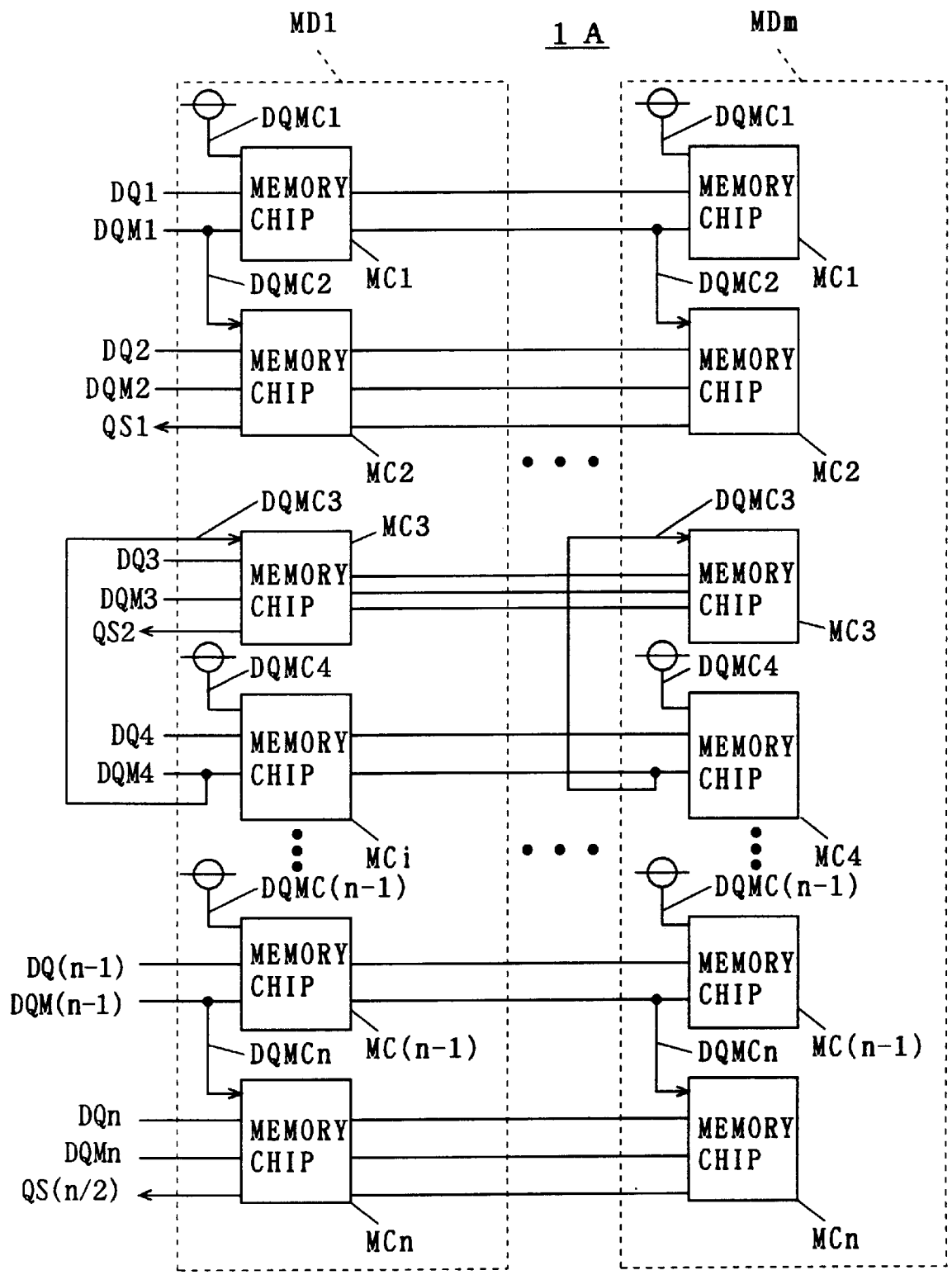

F I G. 2 0
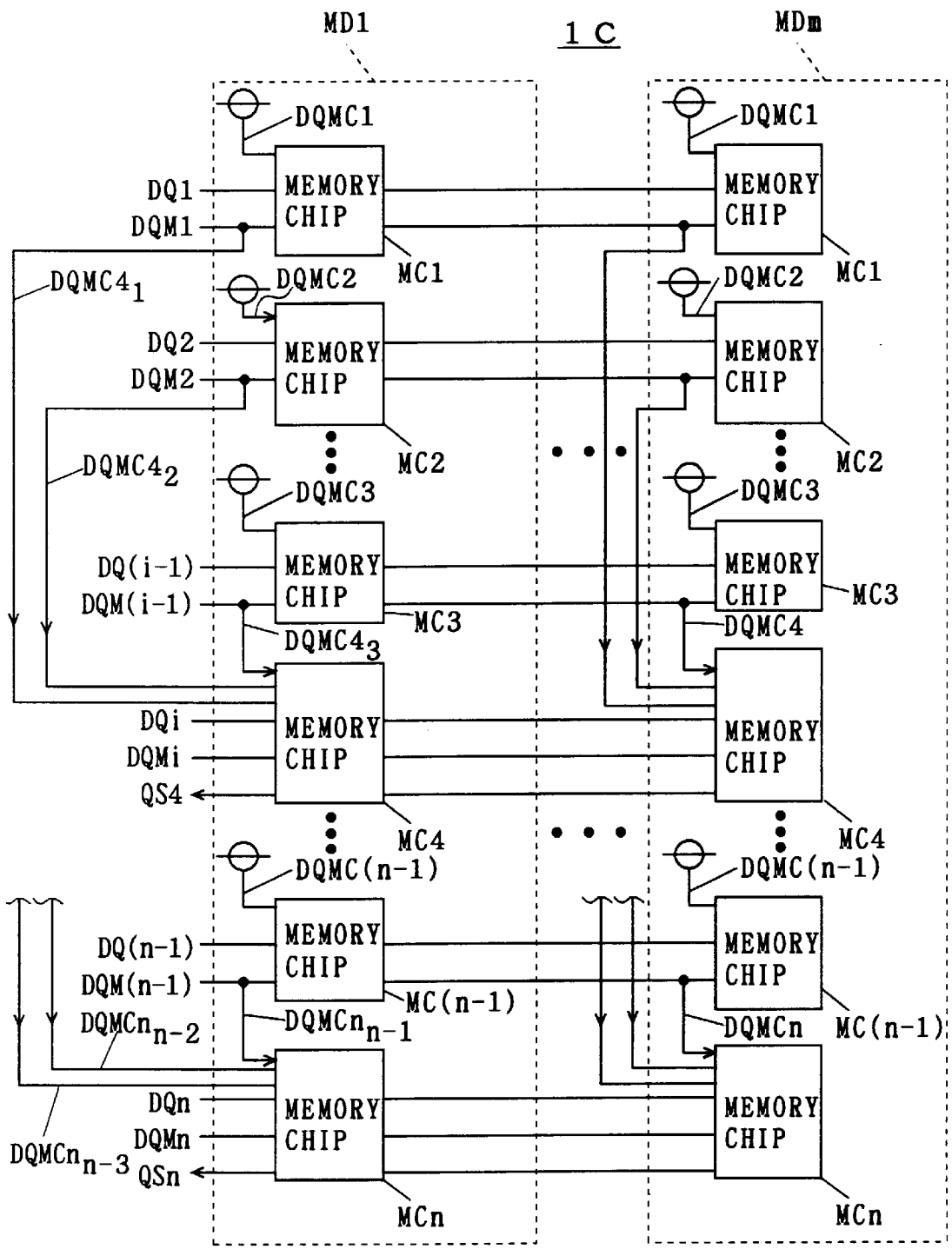

ext.CLK

CLKx2

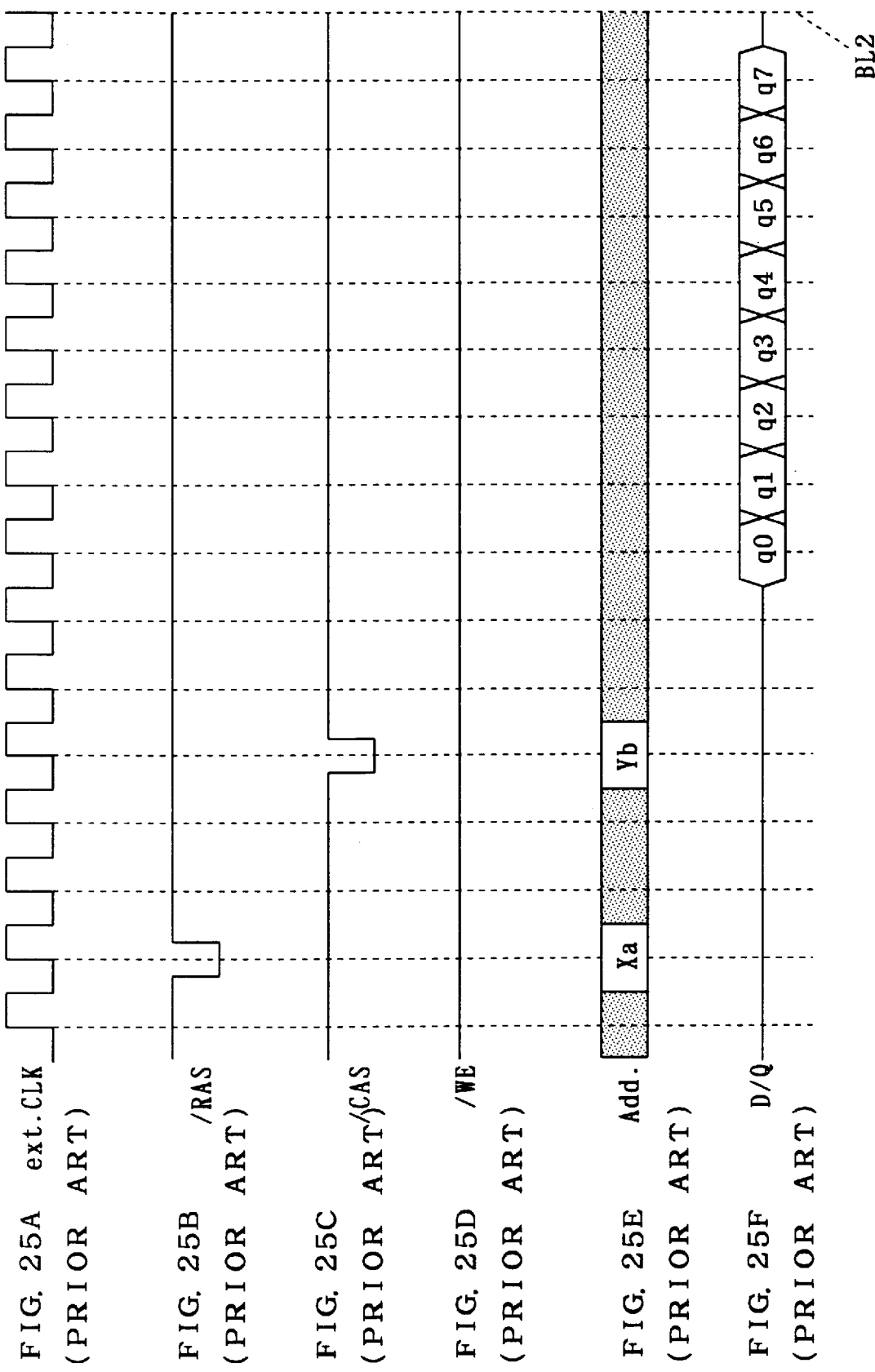

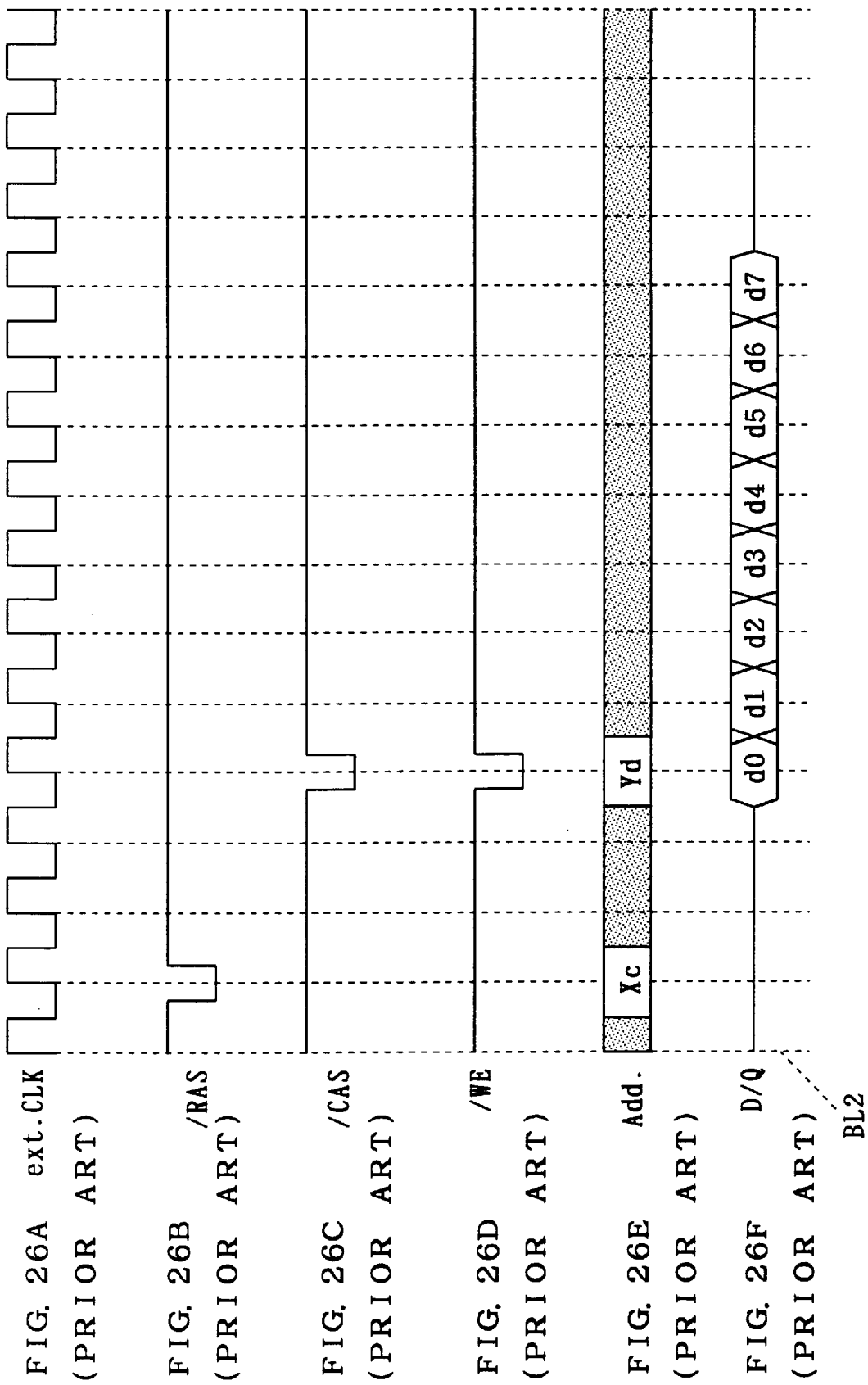

FIG. 29A  ext.CLK
FIG. 29B  ext./CAS
FIG. 29C  DQM
FIG. 29D  DQ
FIG. 29E  QSP
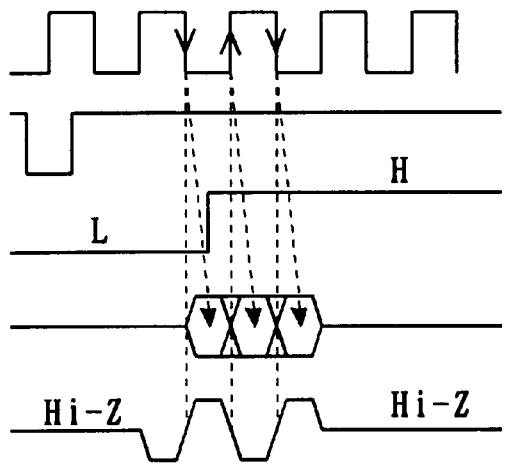
FIG. 30
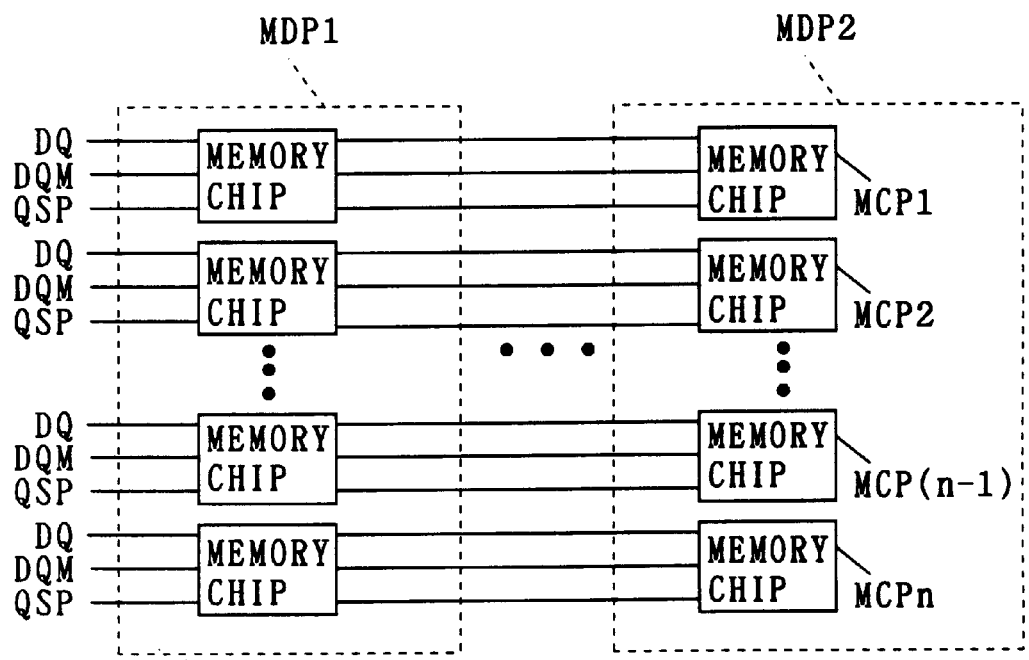

SYNCHRONOUS SEMICONDUCTOR DEVICE WITH MEMORY CHIPS IN A MODULE FOR CONTROLLING OUTPUT OF STROBE SIGNAL FOR TRIGGER IN READING DATA

BACKGROUND OF THE INVENTION

1. Field of the Invention

The present invention relates to a synchronous semiconductor memory device, and in particular, to a mask control technique for the synchronous semiconductor memory device to receive an external signal such as a mask signal in synchronization with a system clock signal externally supplied in a periodic manner, to perform input/output of data at rising and falling edges of the system clock signal and to output a strobe signal to the outside. More specifically, the present invention relates to a random-accessible synchronous dynamic random access memory (SDRAM) and a technique preferably adapted to a mask control for a memory module.

2. Description of the Background Art

Though an operating speed of a dynamic RAM (DRAM) used as a main memory has been improved, yet it can not catch up with that of a microprocessor (MPU). Therefore, it is often said that the slow access time and cycle time of the DRAM should be a bottleneck in improving performance of an entire system. Then, recently, an SDRAM which operates in synchronization with an external system clock signal has been proposed as a main memory for a high-speed MPU.

To realize a high-speed access in an SDRAM, proposed is continuous access in synchronization with the system clock signal, e.g., fast access to a continuous sequence of eight bits of data by a data input/output terminal. Standard timing charts which meet the specification of this continuous access are shown in FIGS. 25A to 25F and 26A to 26F.

These figures show an operation of an SDRAM for input/output of 8-bit data (i.e., 1-byte data) by each of eight data input/output terminals. The SDRAM continuously reads/writes 8-bit data (8×8=64 bits in total). The number of bits to be continuously read is termed a burst length. The burst length of an SDRAM can be changed by a mode register.

In the SDRAM of FIGS. 25A to 25F and 26A to 26F, external control signals (such as a row address strobe signal /RAS, a column address strobe signal /CAS, an address signal Add., a write enable signal /WE) are inputted to a memory chip at a rising edge of an external clock signal ext.CLK which is a system clock.

The address signal Add. consists of time-division multiplexed row address signal X and column address signal Y. When the row address strobe signal /RAS is in active state of "L" level at a rising edge of the external clock signal ext.CLK, the address signal Add. is inputted as a row address signal Xa.

When the column address strobe signal /CAS is in active state of "L" level at a rising edge of the external clock signal ext.CLK, the address signal Add. is inputted as a column address signal Yb. In accordance with the inputted row address signal Xa and column address signal Yb, selection of row and column in a chip of the SDRAM is performed.

The first one of the 8-bit data D/Q is outputted when a predetermined clock period (three clock cycles in FIG. 25F) after the column address strobe signal /CAS falls to "L" level. The number of clocks from the fall of the column address strobe signal /CAS into "L" to the beginning of output of the data D/Q is called "CAS latency", and the CAS latency is determined by the mode register like the burst length. After that, the data q1 to q7 are sequentially outputted in response to a rise of the clock signal ext.CLK.

In writing data, the row address signal Xc is inputted like in reading data. When the column address strobe signal /CAS and the write enable signal /WE are in active state of "L" level at a rising edge of the external clock signal ext.CLK, a column address signal Yd is inputted and data d0 which has been given is inputted to be written. In response to the fall of the external control signals /RAS and /CAS, selection of row and column in the SDRAM is performed. After that, the data d1 to d7 are sequentially written into memory cells in synchronization with the clock signal ext.CLK.

Thus, unlike a conventional DRAM which receives an address signal and input data in synchronization with the external control signals, such as the row address strobe signal /RAS and the column address strobe signal /CAS, an SDRAM receives the external control signals, such as the address strobe signals /RAS and /CAS, the address signal Add. and the write enable signal /WE, and the input data D/Q at a rising edge of the external system clock signal ext.CLK.

Inputting the external control signals and data and reading the data in synchronization with the external clock signal has an advantage of eliminating the need for providing a margin for data input/output time to accommodate a skew (time lag) of the address signal, resulting in less cycle time, and so on. This synchronous operation will allow a high-speed continuous access.

An exemplary system using such an SDRAM is schematically shown in the block diagram of FIG. 27. The system includes a clock generator 2P for generating the system clock signal ext.CLK, a memory controller 3P and an SDRAM device (memory) 1P. The memory controller 3P and the memory 1P perform data transfer using the system clock signal ext. CLK as a trigger. In FIG. 27, the above external control signals and data are generally represented by reference sign 4P.

The SDRAM of FIGS. 25A to 25F, 26A to 26F and 27 has a problem of time lag of signal transfer among modules or among elements which becomes appreciable as the operating frequency becomes faster. For example, when access is made to memory chips in modules by the memory controller 3P, time differential in arrivals of the system clock signal ext.CLK to the memory chips and time differential in arrivals of data from the memory chips to the memory controller 3P are totally recognized as a skew at the time when the memory controller 3P receives data.

To reduce the skew, proposed is a configuration in which a function that each memory chip outputs a strobe signal QSP serving as a trigger signal concurrently with the output of data to the memory controller is added to the above SDRAM. A system using such an SDRAM is shown in FIG. 28, and an exemplary operation timing of each memory chip in the SDRAM is shown in FIGS. 29A to 29E.

The exemplary system operation of FIGS. 29A to 29E has an operation for masking data output in reading data, i.e., a control operation of data masking. The SDRAM performs a data transfer at the rising and falling edges of the system clock signal ext.CLK, unlike that of FIG. 27. In FIGS. 29C and 29E, reference signs DQM and QSF represent a data mask signal and a strobe signal, respectively.

An internal configuration of the SDRAM device 1P of FIG. 28 is shown in FIG. 30. An operation timing of each of memory chips MCP1 to MCPn of FIG. 30 is shown in FIGS. 29A to 29E.

The strobe signal QSP is activated in advance of outputting the data DQ and brought into intermediate potential Hi-Z again when the output of the data DQ is terminated. Therefore, the strobe signal QSP is brought back into the intermediate potential Hi-Z also when the memory controller 3P (FIG. 28) supplies the data mask signal DQM to achieve data masking, as shown in FIGS. 29A to 29B.

As discussed above, the above configuration of an SDRAM, in which each memory chip outputs a strobe signal for trigger along with data and stops outputting the strobe signal if it is intended to terminate outputting data by masking, resolves the problem of skew and allows the external memory controller to clearly recognize which memory chip outputs the transferred data.

In the SDRAM of FIGS. 28, 29A to 29E and 30, however, there arises a new problem of increased interconnection on the modules since the memory chips on the same module each output a strobe signal QSP and data DQ together.

SUMMARY OF THE INVENTION

The present invention is directed to a synchronous semiconductor device. According to a first aspect of the present invention, the synchronous semiconductor device comprises: a module; and a plurality of synchronous memory chips aligned in a sequential row in the module, for receiving external signals for control in synchronization with an external clock signal periodically supplied from the outside and performing a data transfer operation in synchronization with the external clock signal. In the synchronous semiconductor device of the first aspect, any two of the plurality of synchronous memory chips being defined as a first memory chip and a second memory chip, each of the first and second memory chips comprises means for stopping outputting data in response to a data mask signal inhibiting the data transfer operation as one of the external signals, and the second memory chip further comprises data output stop condition detecting means for detecting a shift from the data transfer operation of the first and second memory chips to a data output stop condition based on the data mask signal for the second memory chip and the data mask signal for the first memory chip.

According to a second aspect of the present invention, in the synchronous semiconductor device of the first aspect, the data output stop condition detecting means comprises activation detecting means for receiving the data mask signal for the first memory chip as a data mask control signal therefor and detecting activation of both the data mask signal for the second memory chip and the data mask control signal in synchronization with the external clock signal as a shift to the data output stop condition, and the second memory chip further comprises strobe-signal generation means for activating a strobe signal for trigger before the data transfer operation to output the strobe signal to the outside and stopping outputting the strobe signal in accordance with a detection result of the activation detecting means.

According to a third aspect of the present invention, in the synchronous semiconductor device of the second aspect, the first and second memory chips are adjacent to each other.

According to a fourth aspect of the present invention, in the synchronous semiconductor device of the second aspect, the plurality of synchronous memory chips include a plurality of groups each consisting of the first and second memory chips.

According to a fifth aspect of the present invention, in the synchronous semiconductor device of the second aspect, at least one of the plurality of synchronous memory chips other than the first or second memory chip being defined as a third memory chip, the third memory chip comprises means for stopping outputting data in response to the data mask signal for the third memory chip, the activation detecting means comprises first activation detecting means for receiving the data mask signal for the first memory chip and the data mask signal for the third memory chip and detecting activation of all of the data mask signal for the first memory chip, the data mask signal for the third memory chip and the data mask control signal in synchronization with the external clock signal as a shift to the data output stop condition of the first and third memory chips, and the strobe-signal generation means comprises means for stopping outputting the strobe signal in accordance with a detection result of the first activation detecting means.

According to a sixth aspect of the present invention, in the synchronous semiconductor device of the first aspect, the first memory chip comprises means for generating a second data mask control signal which is activated in accordance with the activation timing of the data mask signal for the first memory chip and the data mask control signal and outputting the second data mask control signal to the second memory chip, and the second memory chip comprises means for detecting activation of both the data mask signal for the second memory chip and the second data mask control signal in synchronization with the external clock signal as a shift to the data output stop condition, generating a data mask control signal which is activated in accordance with the detection timing and outputting the data mask control signal as the first data mask control signal to one of the plurality of synchronous memory chips other than the first or second memory chip.

According to a seventh aspect of the present invention, in the synchronous semiconductor device of the first aspect, the number of synchronous memory chips being n (n≧2), a first one of the plurality of synchronous memory chips receives the data mask signal therefor and a data mask control signal therefor which is always activated, and outputs a first signal which is in an activation level to a second one of the plurality of synchronous memory chips as the data mask control signal therefor only when both the data mask signal and the data mask control signal for the first one are activated in synchronization with the external clock signal, an i-th memory chip out of the second one to a (n−1)-th one of the plurality of synchronous memory chips outputs an i-th signal in the activation level to a (i+1)-th one of the plurality of synchronous memory chips as the data mask control signal for the (i+1)-th one only when both the data mask control signal for the i-th memory chip outputted from a (i−1)-th memory chip and the data mask signal for the i-th memory chip are activated in synchronization with the external clock signal, only an n-th one of the plurality of synchronous memory chips has a function of outputting a strobe signal for trigger which is activated before the data transfer operation to the outside, and the n-th memory chip stops outputting the strobe signal only when both the data mask control signal for the n-th memory chip outputted from a (n−1)-th one of the plurality of synchronous memory chips and the data mask signal for the n-th memory chip are activated in synchronization with the external clock signal.

According to an eighth aspect of the present invention, in the synchronous semiconductor device of the first aspect, each of the plurality of synchronous memory chips receives the external signals and performs the data transfer operation in synchronization with a rising edge and a falling edge of the external clock signal, respectively.

According to a ninth aspect of the present invention, in the synchronous semiconductor device of the first aspect, each of the plurality of synchronous memory chips comprises means for generating an internal clock signal obtained by multiplying the external clock signal by two, and each of the plurality of synchronous memory chips receives the external signals and performs the data transfer operation in synchronization with each edge of the internal clock signal.

According to a tenth aspect of the present invention, in the synchronous semiconductor device of the first aspect, each of the plurality of synchronous memory chips comprises means for generating an internal clock signal which is activated in synchronization with a rising edge of the external clock signal and a timing at which a duty of the external clock signal becomes 50%, and each of the plurality of synchronous memory chips receives the external signals and performs the data transfer operation in synchronization with each edge of the internal clock signal.

According to an eleventh aspect of the present invention, a synchronous semiconductor device, comprises: a module; and a plurality of synchronous memory chips aligned in a sequential row in the module, for receiving external signals for control in synchronization with an external clock signal periodically supplied from an outside and performing a data transfer operation in synchronization with the external clock signal. In the synchronous semiconductor device of the eleventh aspect, the plurality of synchronous memory chips are divided into a plurality of groups each consisting of first and second memory chips, the second memory chip activates a strobe signal for trigger before the data transfer operation and outputs the strobe signal to the outside, and the second memory chip has a function of receiving a data mask signal for the first memory chip as a data mask control signal and of stopping outputting the strobe signal only when both the data mask signal for the second memory chip and the data mask control signal are activated in synchronization with the external clock signal.

According to a twelfth aspect of the present invention, in the synchronous semiconductor device of the eleventh aspect, each of the first and second memory chips further comprises a portion for stopping outputting data in accordance with an activation timing of the corresponding data mask signal.

According to a thirteenth aspect of the present invention, a method of mask-controlling a synchronous semiconductor device, comprises the steps of: inputting an external clock signal and a read command in synchronization with the external clock signal from an outside to first and second memory chips disposed in a module and outputting first a strobe signal for trigger from the second memory chip to the outside in accordance with the read command and secondly data from the first and second memory chips to the outside in synchronization with the external clock signal; and supplying the first memory chip with a first data mask signal in synchronization with the external clock signal from the outside to stop outputting data from the first memory chip in accordance with a first activation timing of the first data mask signal, and supplying the second memory chip with the first data mask signal and a second data mask signal in synchronization with the external clock signal from the outside to stop outputting data and the strobe signal from the second memory chip in accordance with the first activation timing of the first data mask signal and a second activation timing of the second data mask signal.

In the synchronous semiconductor device of the first aspect, one memory chip (the second memory chip) can detect whether the other memory chip (the first memory chip) performs the data transfer operation or not, and therefore the second memory chip can confirm the shift to the data output stop condition of both the memory chips. With this configuration, in a synchronous semiconductor device whose data transfer has been detected by the external controller, a basic technique to cut the number of strobe signals by itself, without being controlled by the external controller, is established.

In the synchronous semiconductor device of the second aspect, the second memory chip receives the data mask signal for the first memory chip as the data mask control signal, to thereby confirm the shift to the data output stop condition of the first memory chip. Further, the second memory chip receives the data mask signal for the second memory chip, to thereby stop outputting data. With this, the second memory chip stops outputting the strobe signal being outputted. Therefore, only the second memory chip has to output the strobe signal and the first memory chip need not output it. That allows a control in the semiconductor device of the present invention to output one strobe signal every two memory chips to the outside with the data mask signal set by byte as is conventional, without special control by the external memory controller, resulting in effective cut of the number of the strobe signals.

The synchronous semiconductor device of the third aspect needs shorter interconnection of the data mask control signals, being adapted better to high-speed synchronization.

In the synchronous semiconductor device of the fourth and eleventh aspects, the second memory chip in each group receives the data mask signal for the first memory chip as the data mask control signal, to confirm the shift to the data output stop condition of the first memory chip. Further, the second memory chip receives the data mask signal for the second memory chip to stop outputting data. With this, the second memory chip stops outputting the strobe signal being outputted. Therefore, in each group of the first and second memory chips, only the second memory chip has to output the strobe signal and the corresponding first memory chip need not output it. That allows a control in the semiconductor device of the present invention to output one strobe signal every two memory chips to the outside with the data mask signal set by byte as is conventional, without special control by the external memory controller, resulting in effective cut of the number of the strobe signals.

In the synchronous semiconductor device of the fifth aspect, it is only necessary to provide one strobe signal line every the first to third memory chips, and therefore effective cut of the number of strobe signals is achieved.

In the synchronous semiconductor device of the sixth aspect, each memory chip has only to detect the data transfer condition of the immediately preceding memory chip, and therefore only the last memory chip needs a function of outputting the strobe signal and stopping outputting it.

In the synchronous semiconductor device of the seventh aspect, first, the first one of the synchronous memory chips stops outputting data in response to the input of the data mask signal for the first one and at the same time outputs the signal indicative of being shifted to the data output stop condition to the second one of the synchronous memory chips since the data mask signal for the first one has been activated. Receiving this data mask signal, the second one of the synchronous memory chips confirms the data transfer condition of the first one, and along with that, stops outputting data in response to the activation of the data mask signal for the second one and outputs the signal indicative of being shifted to the data output stop condition to the next memory chip. When such a chain operation comes to the last n-th memory chip, the n-th memory chip can confirm that all of n memory chips have been shifted to the data output stop condition, and with this confirmation, stops outputting the strobe signal being outputted. Thus, each memory chip has only to detect the data transfer condition of the immediately preceding memory chip and only the last memory chip needs a function of outputting the strobe signal and stopping outputting it. In other words, it is only necessary to output or stop outputting one strobe signal in one module while the data mask signal is controlled by byte as is conventional. That markedly cuts the number of strobe signals.

In the synchronous semiconductor device of the ninth aspect, instead of using the rising and falling edges of the external clock signal, data transfer in synchronization with the edge of the internal clock signal which is twice as fast as the external clock signal produces an advantage of simplicity in circuit configuration of the synchronous semiconductor device.

In the synchronous semiconductor device of the tenth aspect, even if the external clock signal do not have a duty of 50%, the data transfer is performed in synchronization with of the rising and falling edges of the external clock signal, without ill effect.

The first object of the present invention is to provide a mask-control technique for a synchronous semiconductor memory device, to thereby reduce the number of data strobe signals in a module.

The second object of the present invention is to achieve the first object more effectively, and specifically, to extremely reduce the number of data strobe signal lines to one.

The third object of the present invention is to provide the configuration of the synchronous semiconductor memory device without ill effect by unstable duty of an external clock.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing a relation between an SDRAM device and external devices;

FIGS. 2A to 2D are timing charts showing a data masking function of a device of the present invention;

FIGS. 5A to 5F are timing charts showing an exemplary operation of the SDRAM device of FIG. 4;

FIG. 6 is a block diagram showing an internal configuration of each memory chip in the SDRAM device;

FIGS. 7, 8A and 8B are block diagrams each showing an overall configuration of a memory unit in each memory chip;

FIGS. 10A to 10C are timing charts showing an operation of a clock buffer;

FIG. 11 shows a configuration of part of a control-signal generation circuit in the internal controller;

FIGS. 12A to 12E are timing charts showing transitions of signals on the time series;

FIG. 13 shows a configuration of part of a control-signal generation circuit in the internal controller;

FIGS. 16A to 16F are timing charts showing an operation in a pulse system;

FIG. 17 shows a configuration of part of a control-signal generation circuit which operates in the pulse system;

FIGS. 18 to 20 are block diagrams each showing a variation of the first preferred embodiment;

FIGS. 25A to 25F and 26A to 26F are timing charts showing an operation of an SDRAM;

FIGS. 29A to 29E are timing charts showing a problem of the prior-art system; and FIG. 30 is a block diagram showing an internal configuration of the SDRAM device of FIG. 23.

DESCRIPTION OF THE PREFERRED EMBODIMENTS

Figure 3:
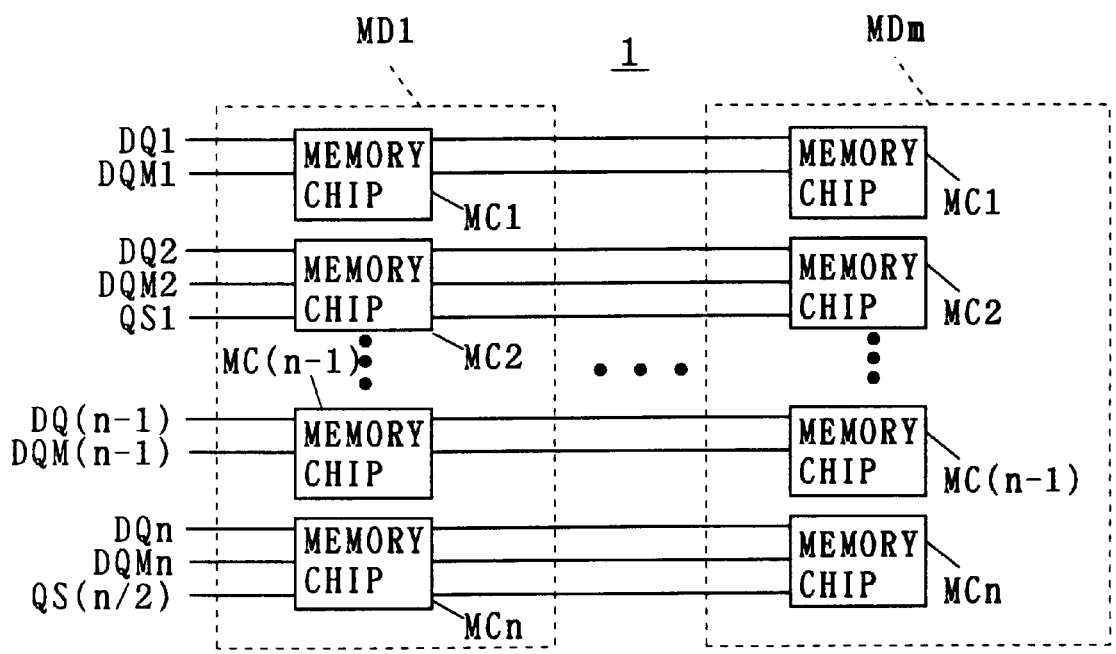
FIG. 3 is a block diagram showing an internal configuration of the SDRAM device which is proposed to cut the number of strobe signals.

The characteristic features of the present invention are, in summary, the following two:

1. With a buffer function provided in the memory chip for receiving a data mask signal DQM for another memory chip on the same module as a data mask control signal DQMC, the memory chip stops outputting the data strobe signal QS when both the data mask signal DQM and the data mask control signal DQMC are activated. Outputting data from each memory chip is terminated when the data mask signal DQM for that memory chip is inputted, being activated. As a result, only one of two memory chips performs a function of outputting the strobe signal QS and stopping outputting it.

2. Each memory chip outputs a signal which is activated when both the inputted data mask signal DQM and data mask control signal DQMC are activated to the next memory chip, and the next memory chip receives the signal as the data mask control signal DQMC. As a result, only the last memory chip in one module performs a function of outputting the strobe signal QS and stopping outputting it.

The above characteristic features 1 and 2 will be discussed below as the first and second preferred embodiments, respectively, with reference to figures.

The First Preferred Embodiment

FIG. 1 is a block diagram schematically showing an overall configuration of a memory system using a synchronous semiconductor device 1 of the present invention. A clock generator 2 of FIG. 1 outputs the system clock signal ext.CLK (referred to as "external clock signal" hereinafter) to a memory controller 3 and the synchronous semiconductor device (SDRAM) 1. The external memory controller 3 outputs external control signals 4 and data signal in writing data to each memory chip in each module of the SDRAM 1 and receives data outputted from each memory chip. In data output operation, the memory controller 3 also receives a strobe signal QS serving as a trigger which is activated and outputted from each module before data output.

The external control signals 4 of FIG. 1 generally represent, for example, a read/write command signal consisting of the row address strobe signal (ext.)/RAS, the column address strobe signal (ext.)/CAS and the write enable signal (ext.)/WE shown in FIGS. 25B to 25D and 26B to 26D, the address signal (ext.)Add. shown in FIG. 25E and the data mask signal DQM shown in FIG. 29C.

The SDRAM 1 of FIG. 1 includes a plurality of modules MD1, . . . , MDm (m>1), and each of the modules may be, for example, a DIMM Dual Inline Memory Module) or an SIMM (Single Inline Memory Module).

A read/write operation of data of the SDRAM 1 of the first preferred embodiment is basically equivalent to that shown in FIGS. 29A to 29E. Specifically, each memory chip receives the external control signals at a rising edge of the external clock signal ext.CLK, and performs a read/write of data at rising and falling edges of the external clock signal ext.CLK whose duty is exactly 50%. Further, only some memory chips output strobe signals QS activated before data output at rising and falling edges of the external clock signal ext.CLK.

In the discussion on this preferred embodiment, "/" preceding the reference sign of a signal represents that the signal is activated in "L" level (the first level).

The SDRAM device 1 of the first preferred embodiment has a data masking (DQM) function. Briefly discussing this function, when the data mask signal is activated in writing data, some of external data are masked and not written in a memory, and on the other hand when activated in reading data, outputting data is terminated (see FIG. 2). The SDRAM 1 of the first preferred embodiment is intended to control the data strobe signal QS to be outputted or not to be outputted for data masking function in reading data, in terms of reduction in the number of data strobe signals (or strobe signal lines) QS.

To reduce the number of data strobe signals QS (simply referred to as "strobe signal" hereinafter), a configuration (not known) as shown in FIG. 3 in which one strobe signal QS is outputted every two memory chips may be used. In this configuration, data (DQ1, DQ2 and the like) outputted from two memory chips (MC1, MC2 and the like) are transferred using a strobe signal QS as a trigger. This preferred embodiment pays attention to few time differentials in arrivals of data DQ1, . . . , DQn and the like outputted from the memory chips aligned in one module to the external memory controller 3 (FIG. 1).

However, there remains the following two problems:

① If the configuration of FIG. 3 is used, although it is needed to stop outputting the strobe signal QS (QS1, . . . , QS(n/2)) when both the two corresponding data mask signals DQM (DQM1, . . . , DQMn) inputted to a combination of two memory chips are activated, one memory chip (e.g., MC2, MCn) which outputs the strobe signal can not singly know if the other memory chip (e.g., MC1, MC(n−1)) outputs data nor judge the data output condition.

② Since data masking is set by byte and performed in order to make byte-control, the external memory controller 3 (FIG. 1) can not control the strobe signal not to be outputted.

Figure 4:
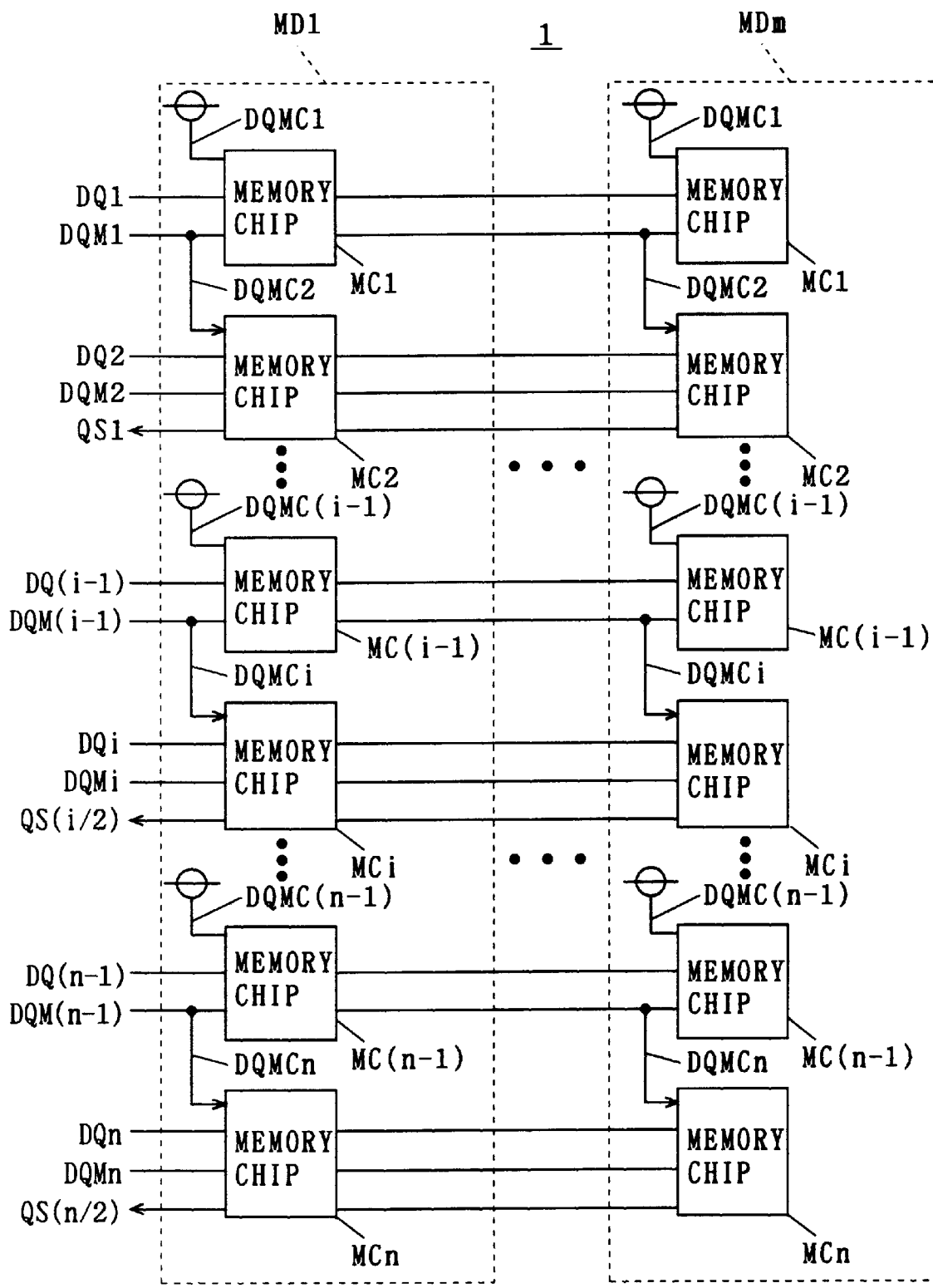
FIG. 4 is a block diagram schematically showing an internal configuration of an SDRAM device in accordance with a first preferred embodiment of the present invention.

In order to solve the problems ① and ② and cut the number of strobe signals, adopting the basic technical concept of the circuit of FIG. 3, an SDRAM 1 of another circuit configuration as shown in FIG. 4 is proposed. Specifically, n memory chips MC1 to MCn (n≧2: if 8×8 bit, n=8) aligned in the same module (MD1, . . . , MDm) are divided into n/2 groups by combining adjacent two memory chips MC(i−1) and MCi (2≦i≦n). In each group, the data mask signal DQM(i−1) (which corresponds to the first data mask signal) for one memory chip MC(i−1) (referred to as "the first memory chip") is inputted as the data mask control signal DQMCi for the other memory chip MCi (referred to as "the second memory chip"), and when both the two signals DQMi (which corresponds to the second data mask signal) and DQMCi are activated (in "H" level (the second level)), the strobe signal QS(i/2) which has been activated before data output by the memory chip MCi and outputted to the outside (3) can be brought into the intermediate potential Hi-Z. In this case, the output of the data signal DQi from the memory chip MCi is controlled only by the data mask signal DQMi, not by the data mask control signal DQMCi. Furthermore, the data mask control signal DQMC(i−1) for the memory chip which does not output the strobe signal QS(i/2), i.e., the first memory chip MC(i−1), is supplied with the potential value of a fixed power supply in "H" level. In this specification, the data mask signal, the data mask control signal and the strobe signal are generally represented by DQM, DQMC and QS, respectively.

With this configuration, the second memory chip MCi in each group can detect the data output condition of the adjacent first memory chip MC(i−1) and that of the second memory chip MCi by the above signals DQMCi and DQMi, respectively within the SDRAM 1, without special control by the external memory controller 3 (FIG. 1). In short, both the byte-control and the control over the strobe signal QS can be achieved.

An exemplary operation timing of the SDRAM device 1 of FIG. 4 is shown in FIGS. 5A to 5F. In FIGS. 5A to 5F, the row address strobe signal ext./RAS, the write enable signal ext./WE, the read/write command signal and the like are not shown, for convenience. These figures show the timing for reading data. In this case, the data mask signal DQM and the data mask control signal DQMC keep in an active level "H" during the read of data once activated. This will be herein referred to as "level system", for explanatory convenience.

Now, a specific circuit configuration of each memory chip MCi of FIG. 4 will be discussed, taking a case of the timing operation as shown in FIGS. 5A to 5F.

A configuration of the memory chip MCi is shown in FIG. 6. The memory chip MCi mainly consists of a memory unit MP (FIGS. 7 and 8) and an internal controller MIC (FIG. 9).

Figure 8A:
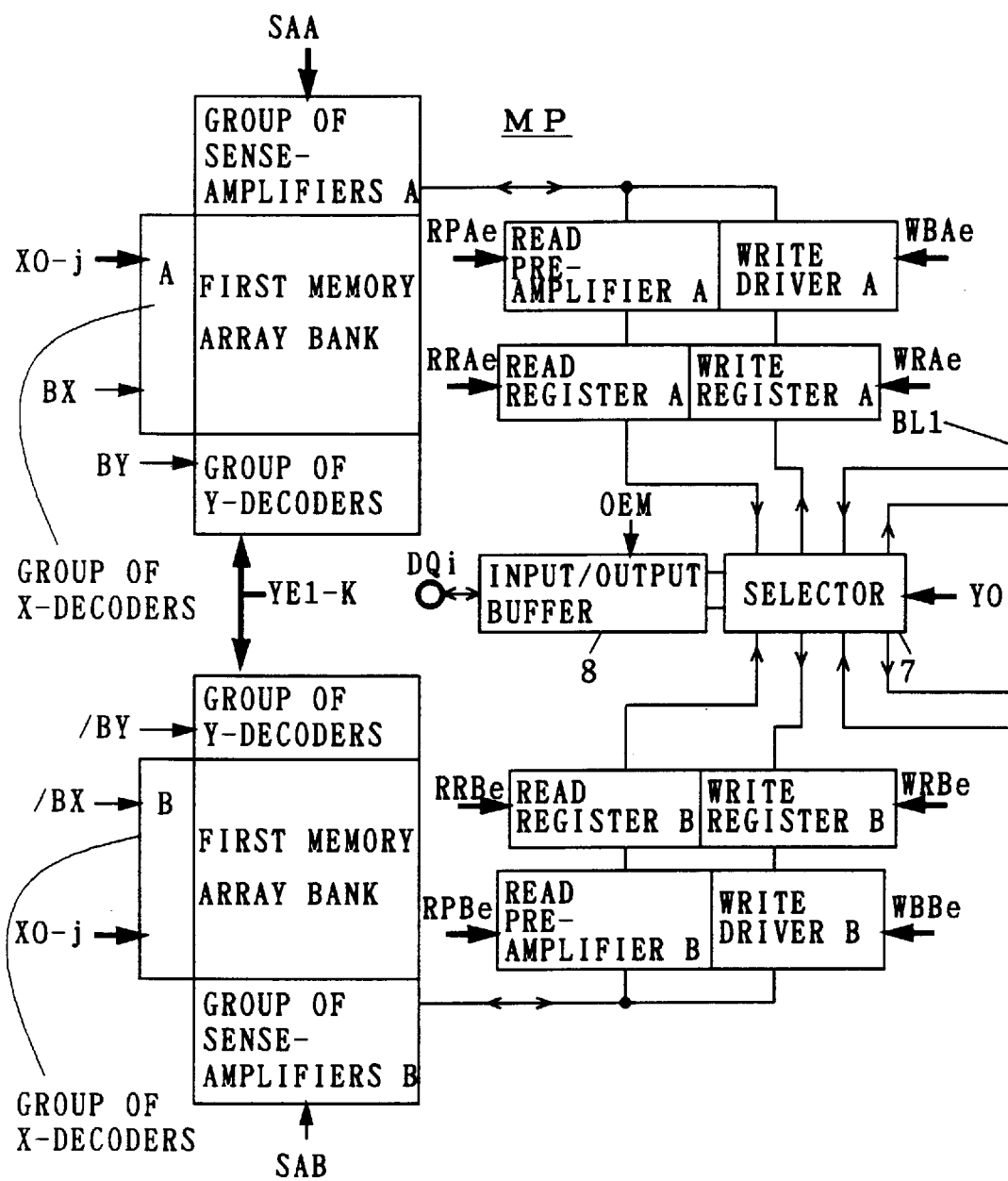
Figure 8B:
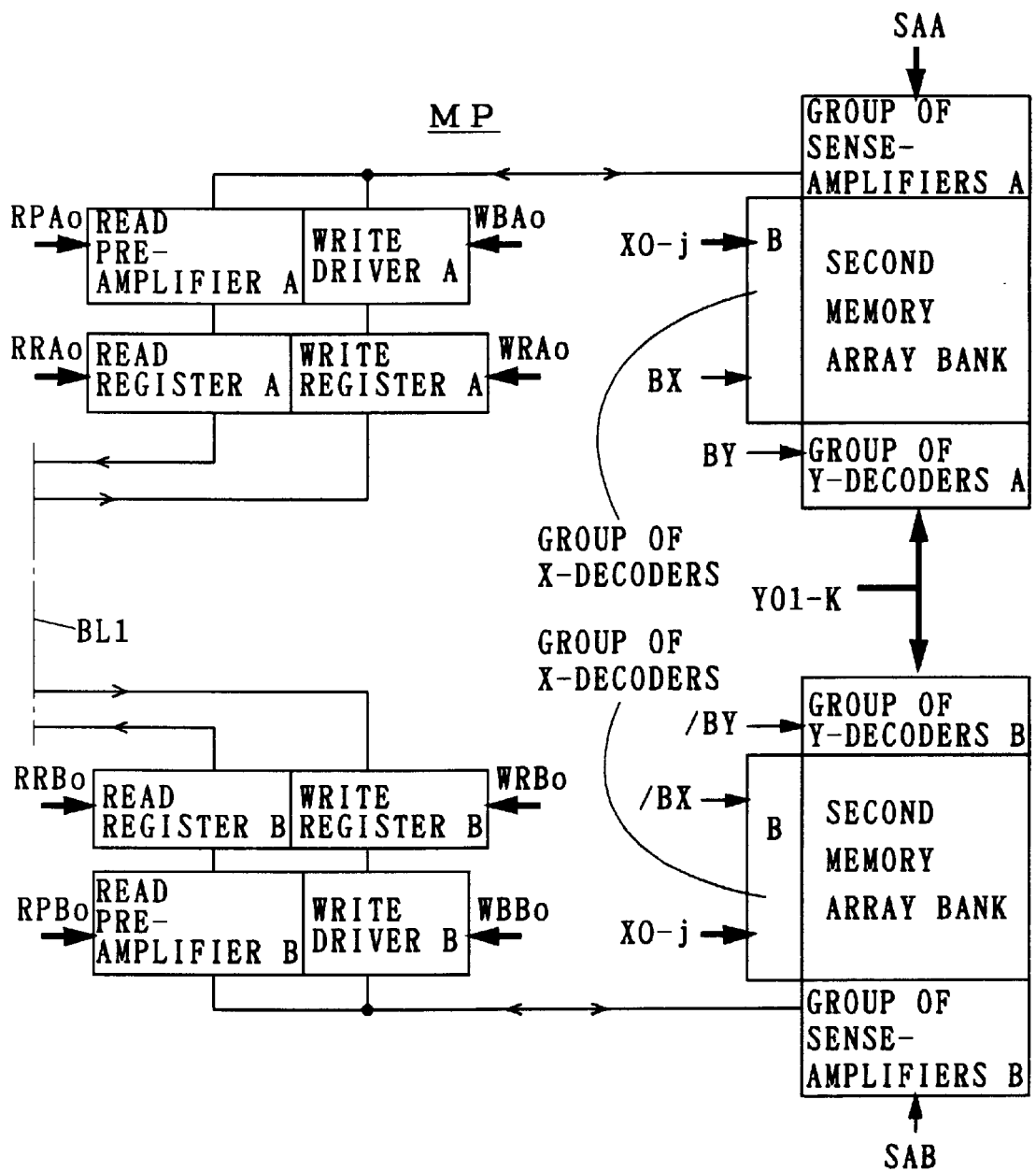
Figure 9:
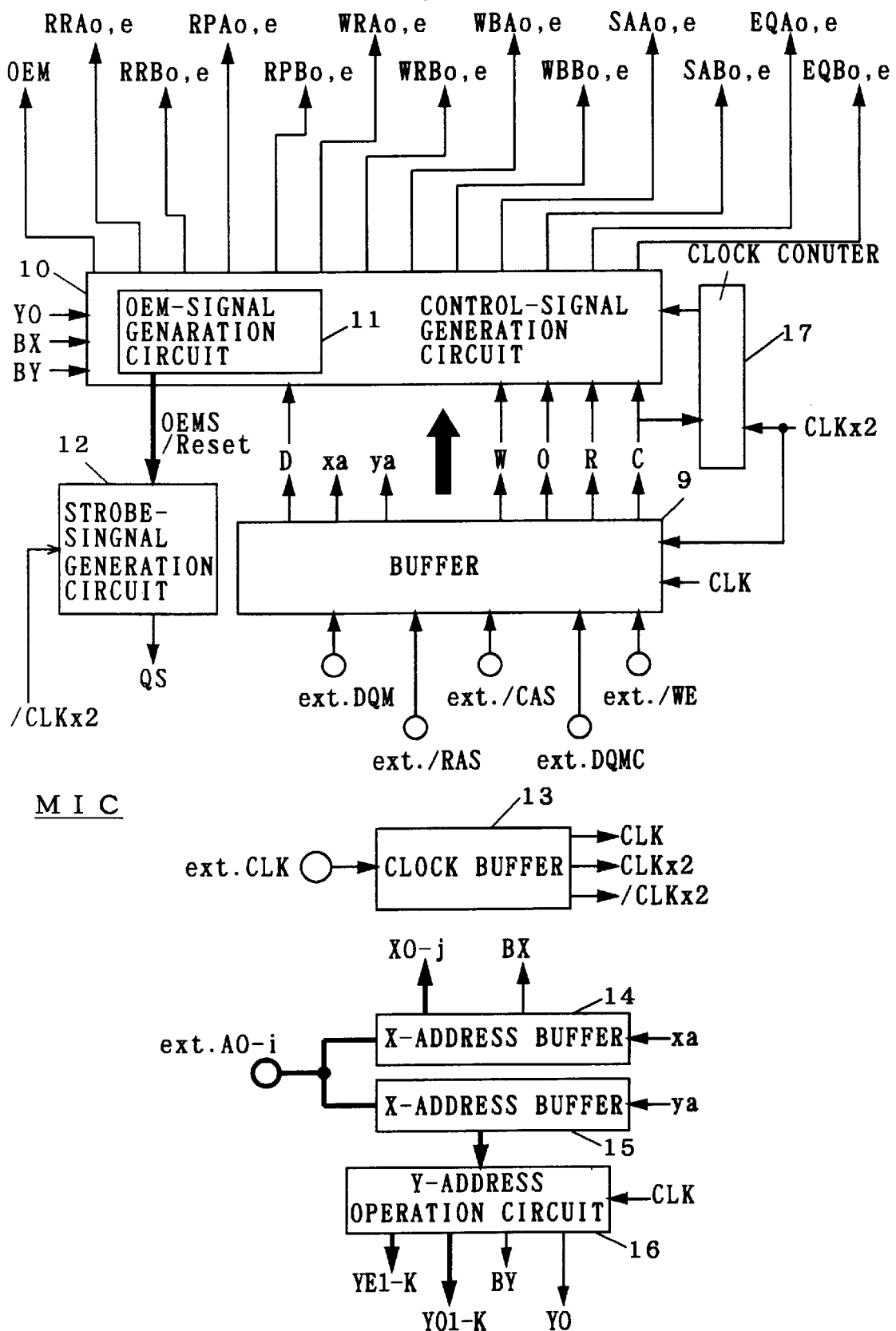
FIG. 9 is a block diagram showing units in an internal controller of each memory chip.

FIGS. 7, 8A and 8B are block diagrams each showing the memory unit MP. The memory unit MP consists of two banks, having a 2-bit prefetch configuration by which data of two bits can be read/written at one time.

A selector 7 of the memory unit MP switches between a first memory array bank (A0, B0) for the odd data and a second memory array bank (A1, B1) for the even data, from/to which 2-bit data are read/written. An input/output buffer 8 performs an input/output of data DQi in response to a buffer control signal OEM, and its internal configuration will be shown later.

Signals WBAe, WBAo, WBBe, WBBo, RPAe, RPAo, RPBe and RPBo are control signals for corresponding drivers or preamplifiers (where subscripts e and o represent even and odd, respectively).

FIG. 9 is a block diagram showing a configuration of the internal controller MIC of the memory chip MCi. The internal controller MIC mainly consists of a buffer 9 for receiving external control signals 4 (FIG. 1) already described, a control-signal generation circuit 10 for generating control signals to be supplied to the memory unit MP of FIG. 7 or 8, a strobe-signal generation circuit 12, a clock buffer 13, an X-address buffer 14, a Y-address buffer 15, a Y-address operation circuit 16 and a clock counter 17. The control-signal generation circuit 10 has an OEM-signal generation circuit 11. In FIG. 9 (also other figures), "ext." represents "external" for the external control signals.

Instead of using the rising and falling edges of the external clock signal ext.CLK, an internal clock having the rising edge of the external clock signal ext.CLK and another rising edge between this rising edge and the next rising edge of the external clock signal ext.CLK is generated within the SDRAM device 1, to which the signals may be synchronized. That produces the following two advantages: (1) the circuit configuration is simplified; and (2) even if the external clock signal ext.CLK does not have duty of completely 50%, it is possible to avoid an ill effect due to that.

In the SDRAM device 1, the clock buffer 13 of FIG. 9 outputs the internal clock CLK×2 (the first internal clock) obtained by multiplying the external clock signal ext.CLK by two as well as the external clock signal ext.CLK as a clock CLK (the second internal clock). Specifically, the second internal clock CLK is a clock having the same frequency as the external clock signal ext.CLK and the first internal clock CLK×2 is a clock having a frequency twice as fast as that frequency to achieve outputs using the rising and falling edges of the external clock signal ext.CLK. Further, the buffer 13 outputs a clock /CLK×2 which is an inversion of the first internal clock signal CLK×2. Operation timings of the clocks ext.CLK, CLK, CLK×2 are shown in FIGS. 10A to 10C, respectively.

FIG. 11 shows an internal configuration of the OEM-signal generation circuit 11. The OEM-signal generation circuit 11 consists of eight latches LA, four NMOS transistors NTr1 driven by the internal clock signal CLK×2 and four NMOS transistors NTr2 driven by the inversion clock /CLK×2. The OEM-signal generation circuit 11 shifts both the data mask signal DQM (ext.DQM) and the data mask control signal DQMC (ext.DQMC) by one cycle of the external clock signal ext.CLK.

A first control signal OEMf shown in FIG. 11 is a signal which keeps activated in "H" level during the timing for outputting the read data DQ1. FIGS. 12A to 12E show the relation in timing of the signal OEMf and the clocks. The reference sign ext.COM of FIG. 12B represents a read-command signal that is a general term for signals (/RAS, /CAS) indicating a data read command. After the read-command signal ext.COM (defined as /READ) is inputted, the counter 17 of FIG. 9 counts the number of pulses of the internal clock signal CLK×2 for the CAS latency, and then the first control signal OEMf is activated. After that, the counter 17 counts the number of pulses of the internal clock signal CLK×2 for the burst length, and then the signal OEMf becomes non-activated.

A circuit 11' for generating the signal OEMf is shown in FIG. 13. The circuit 11' is a part of the OEM-signal generation circuit 11 of FIG. 9. A switch SW1 of FIG. 13 switches the input with time of the burst length and a switch SW2 switches the input with time of the CAS latency.

Figure 14:
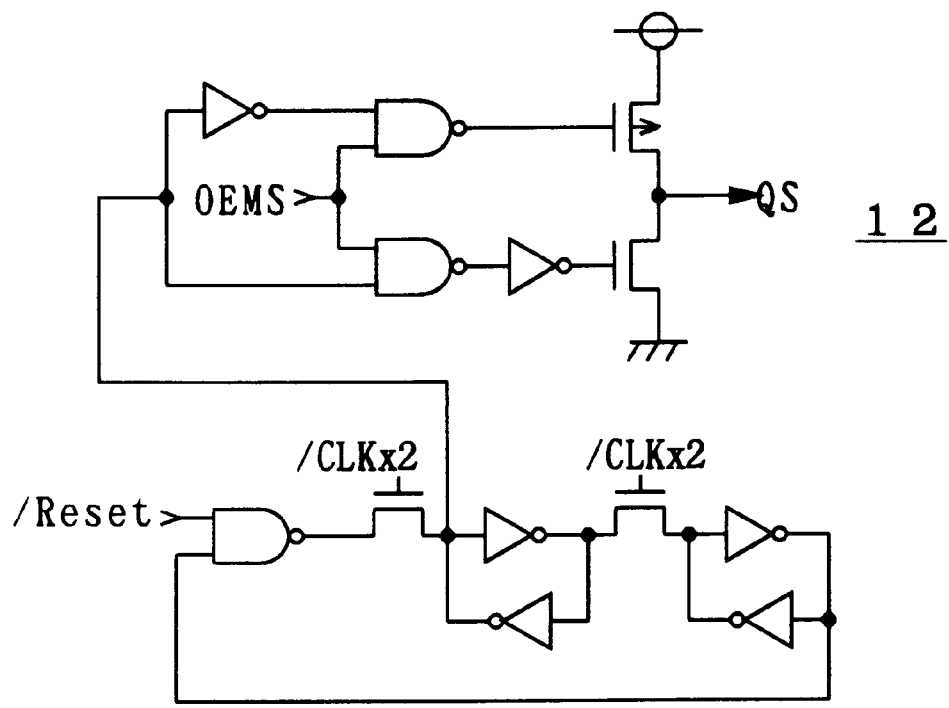
FIG. 14 shows a configuration of a strobe-signal generation circuit.

FIG. 14 shows a configuration of the strobe-signal generation circuit 12 of FIG. 9. Since a reset signal /RESET is activated by the circuit 10 in response to the input of the read-command signal /READ before the data output and the second control signal OEMs is in "L" level then, the strobe signal QS is activated and outputted. After that, as the second control signal OEMs are also activated in "H" level (see FIG. 11) when the data mask signal DQM and the data mask control signal DQMC are activated, the data strobe signal QS is brought into the intermediate potential Hi-Z.

Figure 15:
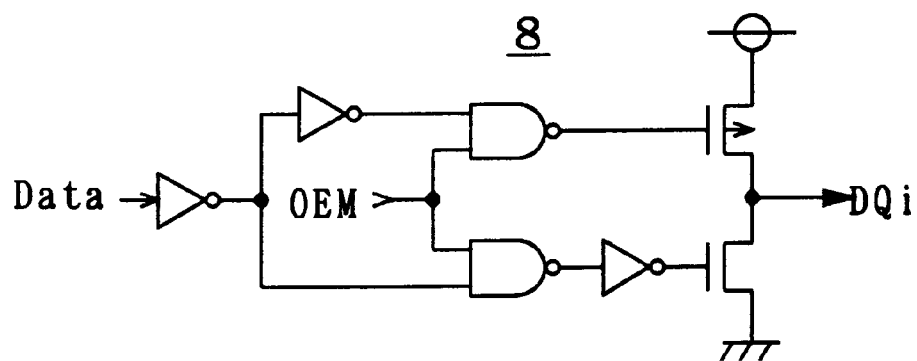
FIG. 15 shows a configuration of an input/output buffer.

FIG. 15 shows an internal configuration of the input/output buffer 8 of FIG. 7. As is clear from the configuration of FIG. 11, the buffer control signal OEM is activated in "H" level in accordance with the activation timing of the data mask signal DQMi, to stop outputting the data DQi.

Thus, the activation of the data mask signal DQM controls the output of the data signal DQ to stop, and the strobe signal QS of FIG. 14 is brought into the intermediate potential Hi-Z again only when both the signals DQM and DQMC are activated.

Variations (1) Instead of the data mask signal DQM (and the data mask control signal DQMC) of level system as shown in FIGS. 5A to 5F, a 1-shot type pulse may be used as the signals DQM and DQMC, as shown in FIGS. 16A to 16F. This will be herein referred to as "pulse system", for explanatory convenience. Therefore, the activation of both the signals DQM and DQMC in the present invention may include the activation of both the signals DQM and DQMC as 1-shot pulse, as shown in FIGS. 16C and 16D.

In this case, only the circuit 11 of FIG. 11 is replaced by a circuit 11A of FIG. 17, and elements other than this are the same as those of FIG. 11.

(2) Instead of the SDRAM device 1 of FIG. 4, an SDRAM device 1A of FIG. 18 may be used. In this case, in a combination of adjacent memory chips, the first and second memory chips are in a reverse relation to each other as if folded.

Figure 19:
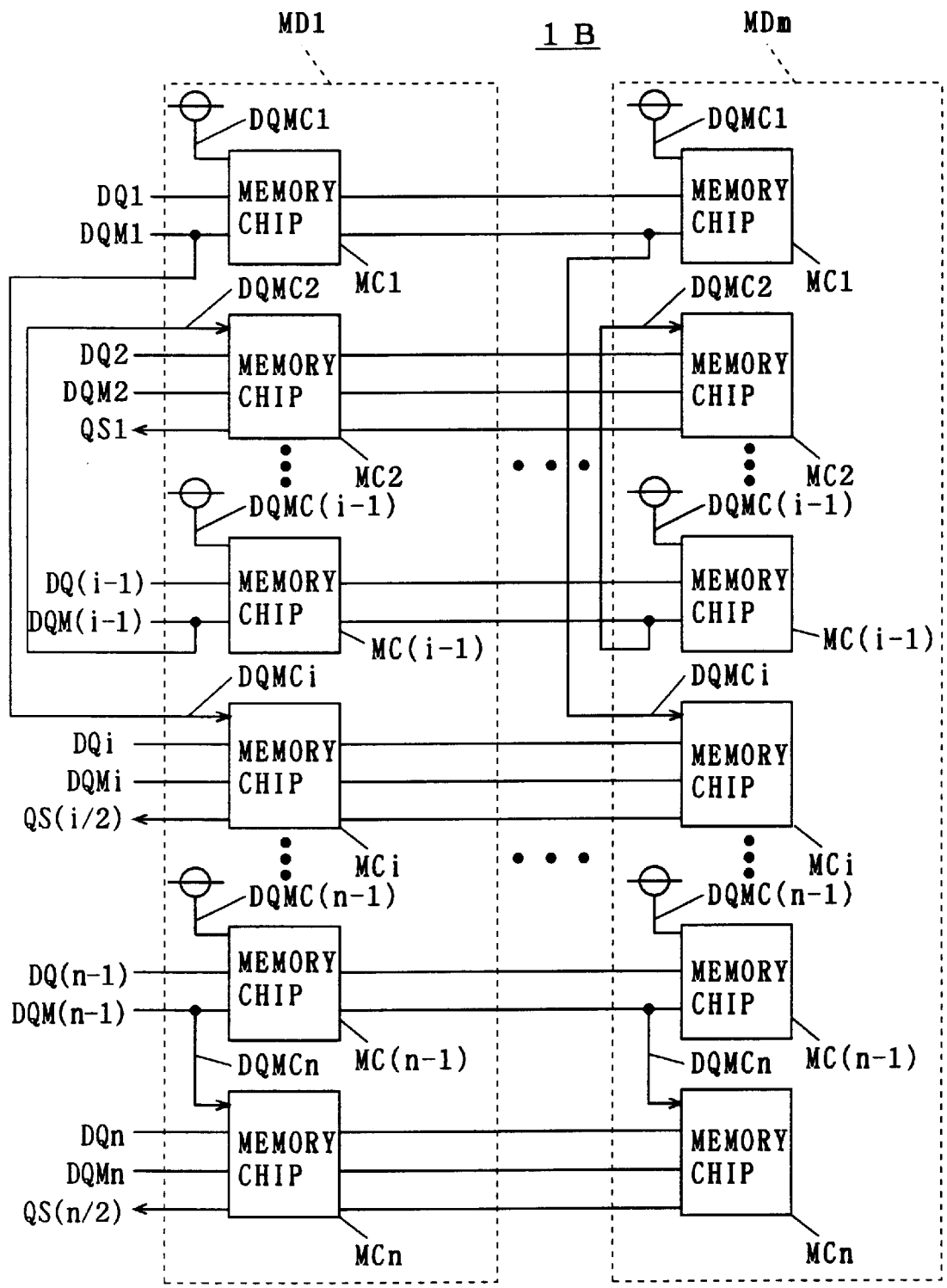

(3) Though the first and second memory chips are adjacent in the above examples, any two of a plurality of memory chips may be selected as the first and second memory chips. FIG. 19 shows an example of this configuration.

(4) Further, as shown in FIG. 20, a plurality of memory chips (four in FIG. 20) may form a group, where one (MC4) of them serves as the second memory chip and the others (MC1 to MC3) serve as the first memory chip. An operation of this case is basically the same as that of FIG. 4. In FIG. 20, when all of data mask control signals DQMC $4_1$ to $4_3$ from the memory chips MC1 to MC3 and a data mask signal DQM4 are activated, a strobe signal QS4 becomes non-activated. That allows farther reduction in the number of strobe signal lines.

Addition

The present invention may apply to a case of using an activation level of the signals opposite to that of the first preferred embodiment.

The Second Preferred Embodiment

In the second preferred embodiment, instead of inputting the data mask signal DQM given to the adjacent memory chip as the data mask control signal DQMC (in other words, outputting one strobe signal every two memory chips), each memory chip outputs a signal which is activated when both the data mask signal DQM and the data mask control signal DQMC for this memory chip are activated (in "H" level herein) as the data mask control signal for the next memory chip and the next memory chip receives the data mask control signal as the data mask control signal therefor, and this operation is sequentially performed in all memory chips.

With this configuration, each memory chip has only to judge the data output stop condition of the preceding adjacent memory chip, unlike the first preferred embodiment, and only the last one of the memory chips in one module outputs or stops outputting the strobe signal QS. Though the configuration of FIG. 20, in particular, has a disadvantage of longer interconnection of the data mask control signals, the second preferred embodiment does not cause this disadvantage any more. This can apply only to the "level system".

Figure 21:
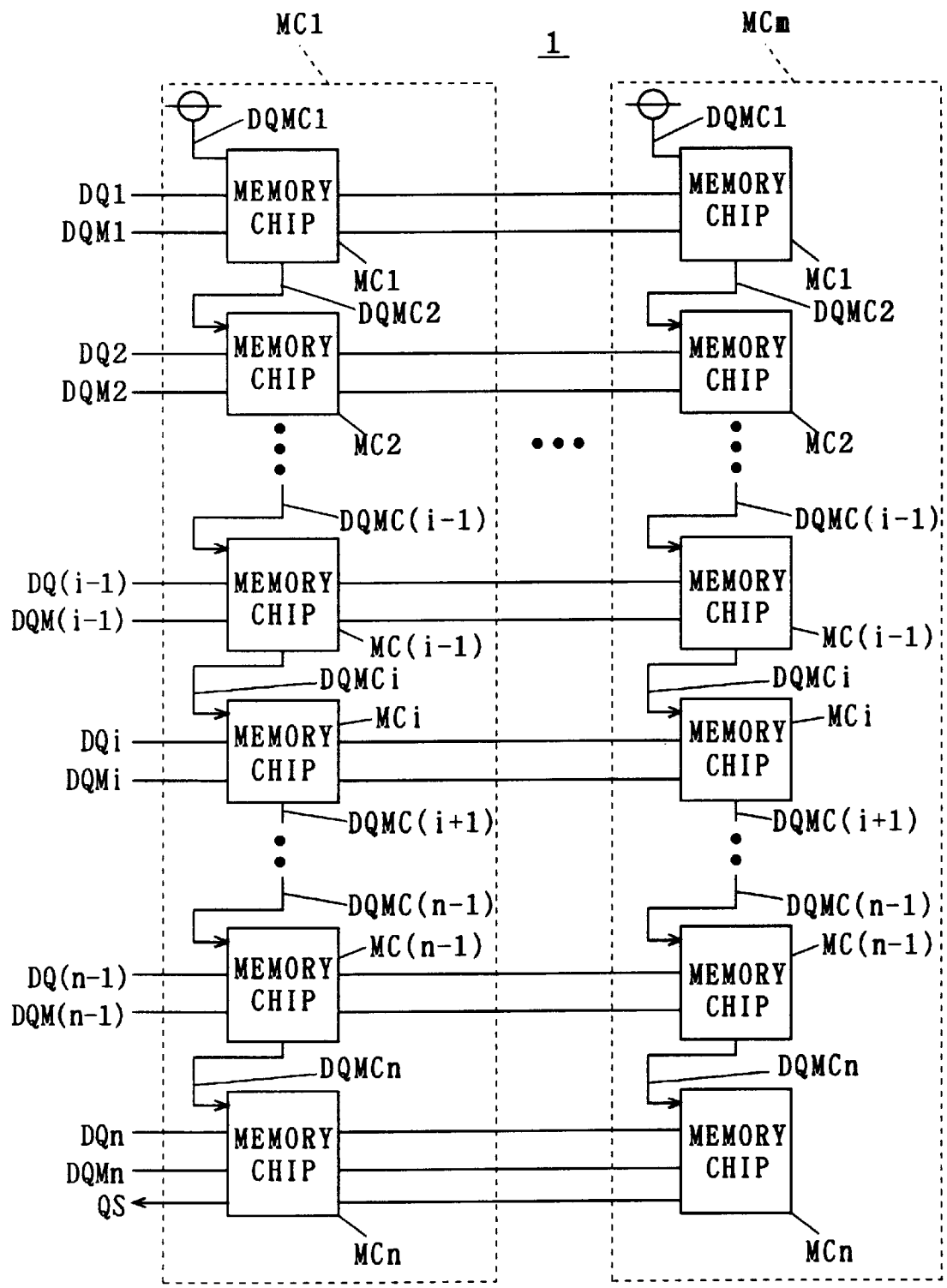
FIG. 21 is a block diagram showing a configuration of an SDRAM device in accordance with a second preferred embodiment of the present invention.

FIG. 21 is a block diagram showing an internal configuration of an SDRAM which adopts this configuration. Herein the number of memory chips provided in a row in one module and the number of modules are generally represented as n (n≧2) and m, respectively.

The circuit configuration of FIG. 21 is different from that of FIG. 4 only in that each memory chip MCi receives a signal generated and outputted by the preceding adjacent memory chip MC(i−1) in the same module (MD1, . . . , MDm) as the data mask control signal DQMCi, and generates and outputs the data mask control signal DQM(i+1) for the next adjacent memory chip MC(i+1) in accordance with the activation timing of the signals DQMi and DQMCi. Therefore, since the memory chip MCn can judge the data output stop condition of the (n−1) memory chips MC1 to MC(n−1) when the data mask control signal DQMC(n−1) is generated and outputted, only the last n-th memory chip MCn outputs or stops outputting the strobe signal QS and only one interconnection for the strobe signal QS is needed.

Figure 22:
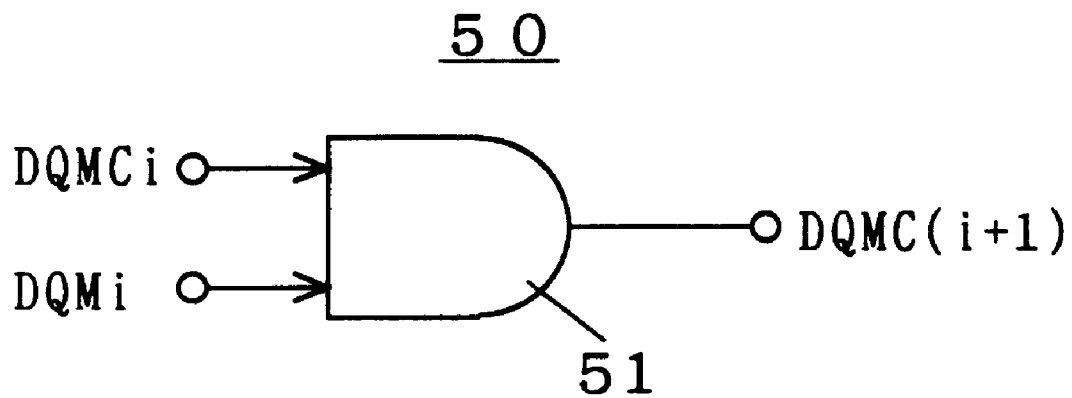
FIG. 22 is a block diagram showing a configuration of a data mask control signal generation circuit in accordance with the second preferred embodiment of the present invention.
Figure 23:
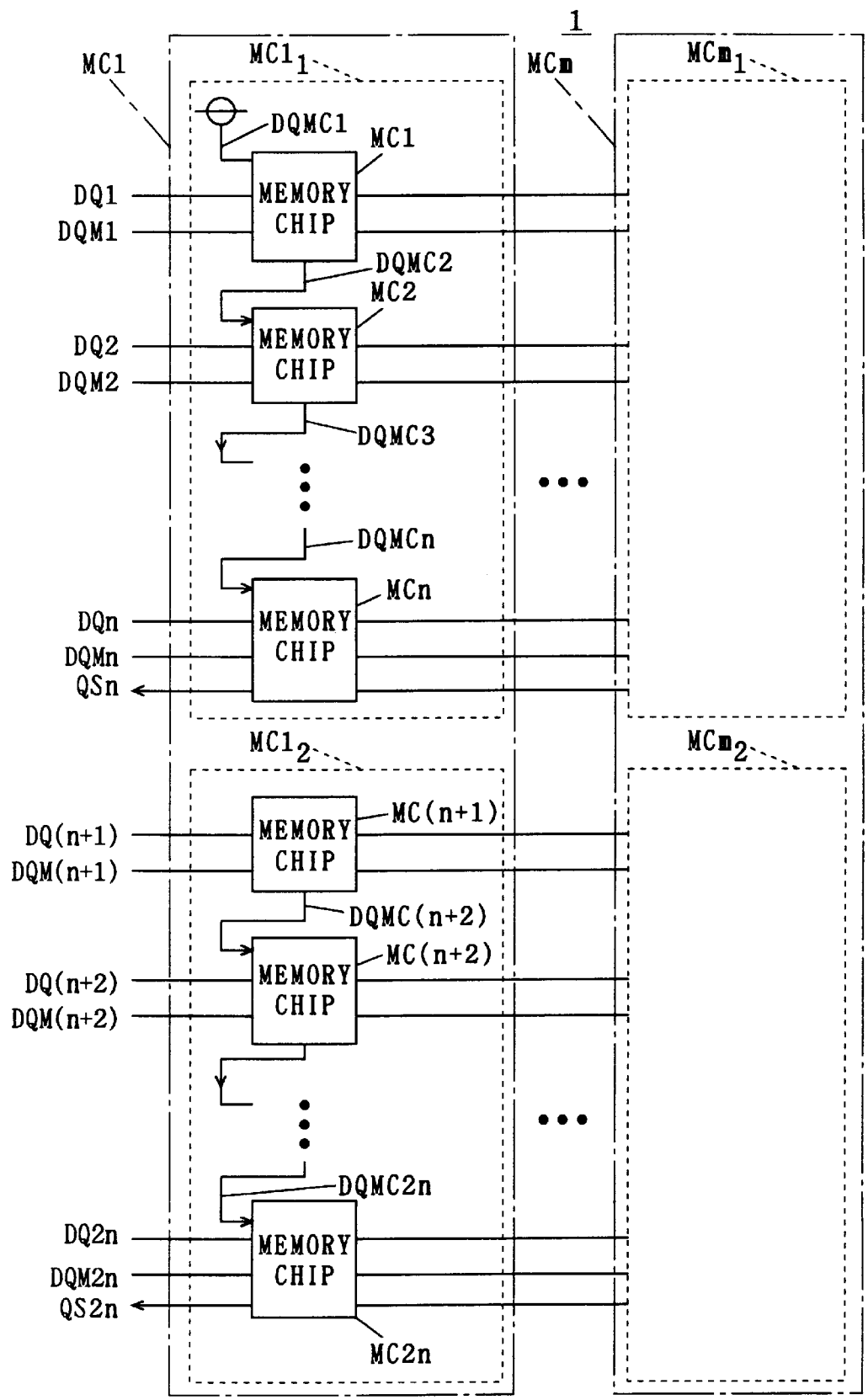
FIG. 23 is a block diagram showing a variation of the second preferred embodiment.

FIG. 22 shows a data mask control signal generation circuit 50 in each memory chip MCi. The data mask control signal generation circuit 50 is constructed of only an AND circuit 51.

Addition 1

A plurality of serials of n synchronous memory chips, each serial shown in FIG. 21, may be provided in one module.

Addition 2

Figures 24A, 24B:
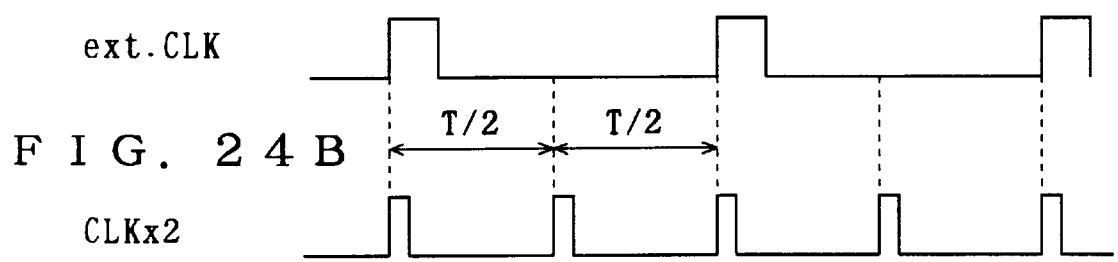
FIGS. 24A and 24B are timing charts showing a variation of generation of the internal clock.
Figure 27:
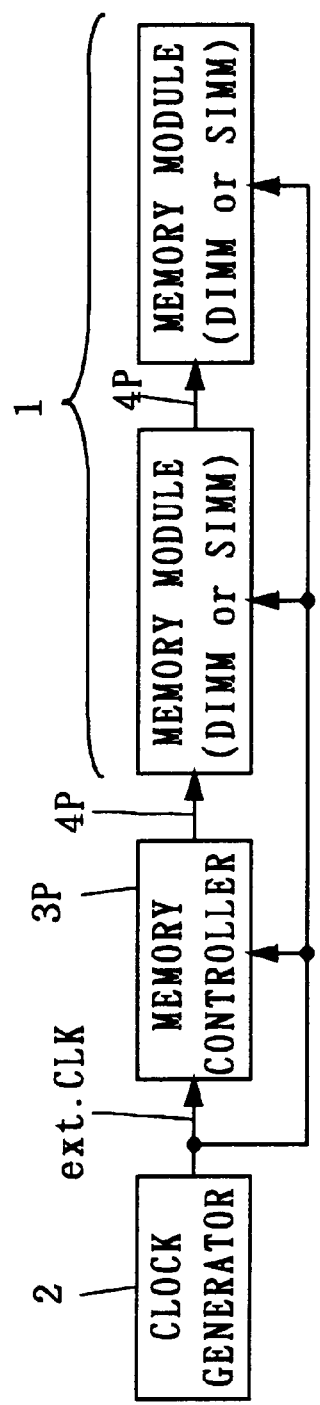
FIG. 27 is a block diagram showing a first system in the prior art.
Figure 28:
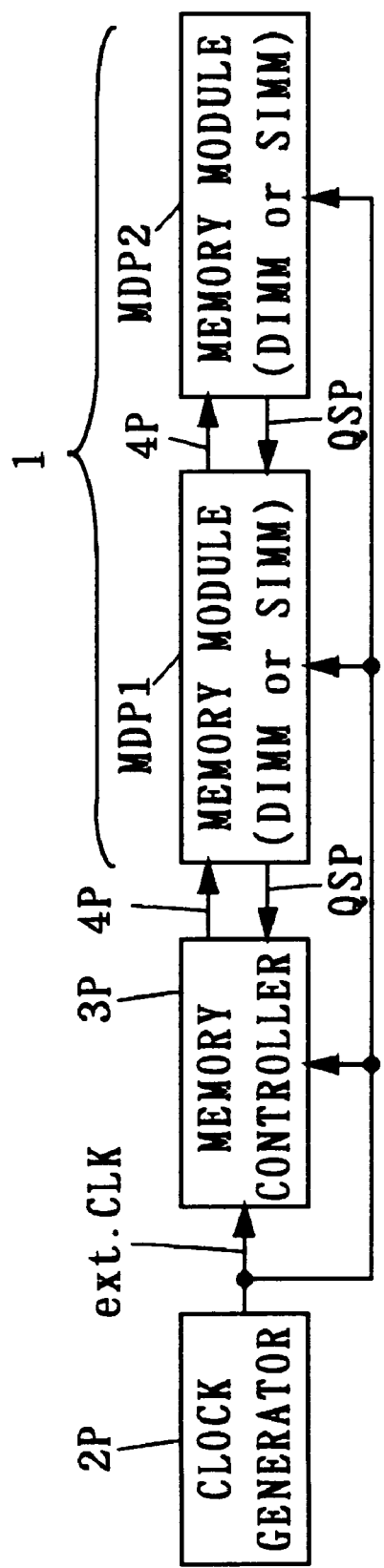
FIG. 28 is a block diagram showing a second system in the prior art.

Signals shown in FIGS. 24A and 24B may be used as the internal clock CLK×2 in both the first and second preferred embodiments.

While the invention has been shown and described in detail, the foregoing description is in all aspects illustrative and not restrictive. It is therefore understood that numerous modifications and variations can be devised without departing from the scope of the invention.

We claim:

1. A synchronous semiconductor device comprising:

a module; and a plurality of synchronous memory chips aligned in a sequential row in said module, for receiving external signals for control in synchronization with an external clock signal periodically supplied from the outside and performing a data transfer operation in synchronization with said external clock signal, wherein any two of said plurality of synchronous memory chips are defined as a first memory chip and a second memory chip, said first memory chip comprises means for stopping outputting data in response to a data mask signal for said first memory chip inhibiting said data transfer operation as one of said external signals, and said second memory chip comprises means for stopping outputting data in response to a data mask signal for said second memory chip inhibiting said data transfer operation as one of said external signals, and said second memory chip further comprises data output stop condition detecting means for detecting a shift from said data transfer operation of said first and second memory chips to a data output stop condition based on said data mask signal for said second memory chip and said data mask signal for said first memory chip.

2. The synchronous semiconductor device of claim 1, wherein said data output stop condition detecting means comprises activation detecting means for receiving said data mask signal for said first memory chip as a data mask control signal and detecting activation of both said data mask signal for said second memory chip and said data mask control signal in synchronization with said external clock signal as a shift to said data output stop condition, and said second memory chip further comprises strobe-signal generation means for activating a strobe signal for trigger before said data transfer operation to output said strobe signal to the outside and stopping outputting said strobe signal in accordance with a detection result of said activation detecting means.

3. The synchronous semiconductor device of claim 2, wherein said first and second memory chips are adjacent to each other.

4. The synchronous semiconductor device of claim 2, wherein said plurality of synchronous memory chips include a plurality of groups each consisting of said first and second memory chips.

5. The synchronous semiconductor device of claim 2, wherein at least one of said plurality of synchronous memory chips other than said first or second memory chip is defined as a third memory chip, said third memory chip comprises means for stopping outputting data in response to a data mask signal for said third memory chip, said activation detecting means comprises first activation detecting means for receiving said data mask signal for said first memory chip and said data mask signal for said third memory chip and detecting activation of all of said data mask signal for said second memory chip, said data mask signal for said third memory chip and said data mask control signal in synchronization with said external clock signal as a shift to said data output stop condition of said first and third memory chips, and said strobe-signal generation means comprises means for stopping outputting said strobe signal in accordance with a detection result of said first activation detecting means.

6. The synchronous semiconductor device of claim 1, wherein said first memory chip comprises
  means for generating a second data mask control signal which is activated in accordance with the activation timing of said data mask signal for said first memory chip and a first data mask control signal and outputting said second data mask control signal to said second memory chip, and
said second memory chip comprises
  means for detecting activation of both said data mask signal for said second memory chip and said second data mask control signal in synchronization with said external clock signal as a shift to said data output stop condition, generating a data mask control signal which is activated in accordance with the detection timing and outputting said data mask control signal as said first data mask control signal to one of said plurality of synchronous memory chips other than said first or second memory chip.

7. The synchronous semiconductor device of claim 1, wherein
  the number of synchronous memory chips is n (n≧2),
  a first one of said plurality of synchronous memory chips receives a data mask signal therefor and a data mask control signal therefor which is always activated, and outputs a first signal which is in an activation level to a second one of said plurality of synchronous memory chips as said data mask control signal therefor only when both said data mask signal and said data mask control signal for said first one are activated in synchronization with said external clock signal,
  an i-th memory chip out of said second one to a (n−1)-th one of said plurality of synchronous memory chips outputs an i-th signal in said activation level to a (i+1)-th one of said plurality of synchronous memory chips as a data mask control signal for said (i+1)-th one only when both a data mask control signal for said i-th memory chip outputted from a (i−1)-th memory chip and a data mask signal for said i-th memory chip are activated in synchronization with said external clock signal,
  only an n-th one of said plurality of synchronous memory chips has a function of outputting a strobe signal for trigger which is activated before said data transfer operation to the outside, and
  said n-th memory chip stops outputting said strobe signal only when both said data mask control signal for said n-th memory chip outputted from a (n−1)-th one of said plurality of synchronous memory chips and a data mask signal for said n-th memory chip are activated in synchronization with said external clock signal.

8. The synchronous semiconductor device of claim 1, wherein
  each of said plurality of synchronous memory chips receives said external signals and performs said data transfer operation in synchronization with a rising edge and a falling edge of said external clock signal, respectively.

9. The synchronous semiconductor device of claim 1, wherein
  each of said plurality of synchronous memory chips comprises
  means for generating an internal clock signal obtained by multiplying said external clock signal by two, and
  each of said plurality of synchronous memory chips receives said external signals and performs said data transfer operation in synchronization with each edge of said internal clock signal.

10. The synchronous semiconductor device of claim 1, wherein
  each of said plurality of synchronous memory chips comprises
  means for generating an internal clock signal which is activated in synchronization with a rising edge of said external clock signal and a timing at which a duty of said external clock signal becomes 50%, and
  each of said plurality of synchronous memory chips receives said external signals and performs said data transfer operation in synchronization with each edge of said internal clock signal.

11. A synchronous semiconductor device, comprising:
  a module; and
  a plurality of synchronous memory chips aligned in a sequential row in said module, for receiving external signals for control in synchronization with an external clock signal periodically supplied from an outside and performing a data transfer operation in synchronization with said external clock signal,
  wherein said plurality of synchronous memory chips are divided into a plurality of groups each consisting of first and second memory chips,
  said second memory chip activates a strobe signal for trigger before said data transfer operation and outputs said strobe signal to said outside, and
  said second memory chip has a function of receiving a data mask signal for said first memory chip as a data mask control signal and a data mask signal for said second memory chip and of stopping outputting said strobe signal only when both said data mask signal for said second memory chip and said data mask control signal are activated in synchronization with said external clock signal.

12. The synchronous semiconductor device of claim 11, wherein
  each of said first and second memory chips further comprises
  a portion for stopping outputting data in accordance with an activation timing of said corresponding data mask signal.

13. A method of mask-controlling a synchronous semiconductor device, comprising the steps of:
  inputting an external clock signal and a read command in synchronization with said external clock signal from an outside to first and second memory chips disposed in a module and outputting first a strobe signal for trigger from said second memory chip to said outside in accordance with said read command and secondly data from said first and second memory chips to said outside in synchronization with said external clock signal; and
  supplying said first memory chip with a first data mask signal in synchronization with said external clock signal from said outside to stop outputting data from said first memory chip in accordance with a first activation timing of said first data mask signal, and supplying said second memory chip with said first data mask signal and a second data mask signal in synchronization with said external clock signal from said outside to stop outputting data and said strobe signal from said second memory chip in accordance with said first activation timing of said first data mask signal and a second activation timing of said second data mask signal.

* * * * *